US008617923B2

(12) United States Patent
Koyanagi

(10) Patent No.: US 8,617,923 B2
(45) Date of Patent: Dec. 31, 2013

(54) SEMICONDUCTOR DEVICE MANUFACTURING APPARATUS AND METHOD FOR MANUFACTURING SEMICONDUCTOR DEVICE

(75) Inventor: Tadashi Koyanagi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 64 days.

(21) Appl. No.: 13/438,482

(22) Filed: Apr. 3, 2012

(65) Prior Publication Data
US 2012/0252166 A1 Oct. 4, 2012

(30) Foreign Application Priority Data

Apr. 4, 2011 (JP) ................................. 2011-082824

(51) Int. Cl.
*H01L 21/58* (2006.01)
(52) U.S. Cl.
USPC .................. 438/108; 438/118; 257/E21.503; 257/E21.511
(58) Field of Classification Search
USPC ............ 438/108, 118; 257/E21.503, E21.511
See application file for complete search history.

(56) References Cited

U.S. PATENT DOCUMENTS

| 7,598,121 | B2 | 10/2009 | Kinoshita et al. | |
|---|---|---|---|---|
| 2005/0140023 | A1 | 6/2005 | Kinoshita et al. | |
| 2007/0281395 | A1* | 12/2007 | Kira et al. | 438/118 |
| 2012/0252166 | A1* | 10/2012 | Koyanagi | 438/109 |

FOREIGN PATENT DOCUMENTS

| JP | 2005-191053 A | 7/2005 |
|---|---|---|
| JP | 2006-100800 A | 4/2006 |

* cited by examiner

*Primary Examiner* — George Fourson, III
(74) *Attorney, Agent, or Firm* — Foley & Lardner LP

(57) ABSTRACT

A semiconductor device manufacturing method is provided. First and second semiconductor chips are prepared, including first and second electrodes on first and second surfaces respectively. The second semiconductor chip includes a third electrode on a third surface opposite to the second surface. The third electrode overlaps the second electrode. The second surface includes an electrode-free region that is free of any electrode. A sealing resin is applied on the first surface of the first semiconductor chip. A second surface of the first semiconductor chip is held by a bonding tool including a pressing surface and a supporting-portion projected from the pressing surface. The pressing surface is made into contact with the second electrode. The supporting-portion is arranged at a position facing the electrode-free region. The second semiconductor chip is stacked over the first semiconductor chip by the bonding tool to electrically connect the third electrode to the first electrode.

20 Claims, 24 Drawing Sheets

SEMICONDUCTOR DEVICE MANUFACTURING APPARATUS AND METHOD FOR MANUFACTURING SEMICONDUCTOR DEVICE

BACKGROUND OF THE INVENTION

1. Field of the Invention

The present invention relates to a semiconductor device manufacturing apparatus and a method for manufacturing a semiconductor device.

Priority is claimed on Japanese Patent Application No. 2011-82824, filed Apr. 4, 2011, the content of which is incorporated herein by reference.

2. Description of the Related Art

With an increase in the level of integration of semiconductor chips in recent years, there have been accompanying advances, with increasing chip sizes and advances in nanoscaling and multi-leveling of interconnects. In order to achieve a higher packaging density, it has become necessary to reduce the package size and thickness.

To accommodate such demands, art regarding MCPs (multichip packages), in which a plurality of semiconductor chips are mounted with high density onto a single interconnect substrate, has been developed. In this art, a CoC (chip-on-chip) type of semiconductor package (semiconductor device), in which a chip stack of semiconductor chips having through electrodes known as TSVs (through silicon vias) is mounted onto the main surface of an interconnect substrate, has gained attention.

When mounting semiconductor chips with high density on an interconnect substrate, a semiconductor device manufacturing apparatus called a bonding apparatus is used.

Japanese Patent Application Publication No. JPA 2005-191053 discloses art of flip-chip mounting a semiconductor chip onto an interconnect substrate, by first applying an NCP (non-conductive paste) to the interconnect substrate and holding the rear surface of a semiconductor chip that has electrodes (bump electrodes) with a vacuum chucking block that has a flat suction chucking surface.

Although it is not a bonding tool, Japanese Patent Application Publication No. JPA 2006-100800 discloses a vacuum chucking nozzle that has a contacting surface that makes contact with a semiconductor chip at the position of the gap between electrodes of the semiconductor chip.

SUMMARY

In one embodiment, a method of manufacturing a semiconductor device may include, but is not limited to, the following processes. First and second semiconductor chips are prepared. The first semiconductor chip includes a first electrode on a first surface. The second semiconductor chip includes a second electrode on a second surface and a third electrode on a third surface that is opposite to the second surface. The third electrode is overlapped to the second electrode. The second surface includes an electrode-free region that is free of any electrode. A sealing resin is applied on the first surface of the first semiconductor chip. A second surface of the first semiconductor chip is held by a bonding tool including a pressing surface and a supporting-portion projected from the pressing surface. The pressing surface is in contact with the second electrode. The supporting-portion is arranged at a position facing the electrode-free region. The second semiconductor chip is stacked over the first semiconductor chip by the bonding tool so as to electrically connect the third electrode to the first electrode. The sealing resin is filled in a space between the first and second semiconductor chips. The sealing resin is hardened after stacking the second semiconductor chip on the first semiconductor chip. The first semiconductor chip, the second semiconductor chip and the sealing resin are disposed to form a stacked structure.

In an embodiment, an apparatus for manufacturing a semiconductor device may include, but is not limited to, a bonding tool. The bonding tool may include, but is not limited to, a depressed pressing-portion, and a projected supporting-portion. The depressed pressing-portion has a pressing surface configured to press a first electrode on a first surface of a chip. The projected supporting-portion has a supporting surface adjacent to the pressing surface. The supporting surface is configured to support an electrode-free region of the first surface of the first chip. The electrode-free region is free of any electrode. The supporting surface is projected from the pressing surface.

In another embodiment, a method of manufacturing a semiconductor device may include, but is not limited to, holding a chip on a bonding tool. The chip has first and second surfaces opposite to each other and at least a first electrode on the first surface and at least a second electrode on the second surface. The first surface has an electrode-free region that is free of any electrode. The bonding tool may include, but is not limited to, a depressed pressing-portion having a pressing surface configured to press the first electrode; and a projected supporting-portion having a supporting surface adjacent to the pressing surface. The supporting surface is configured to support the electrode-free region. The supporting surface is projected from the pressing surface.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
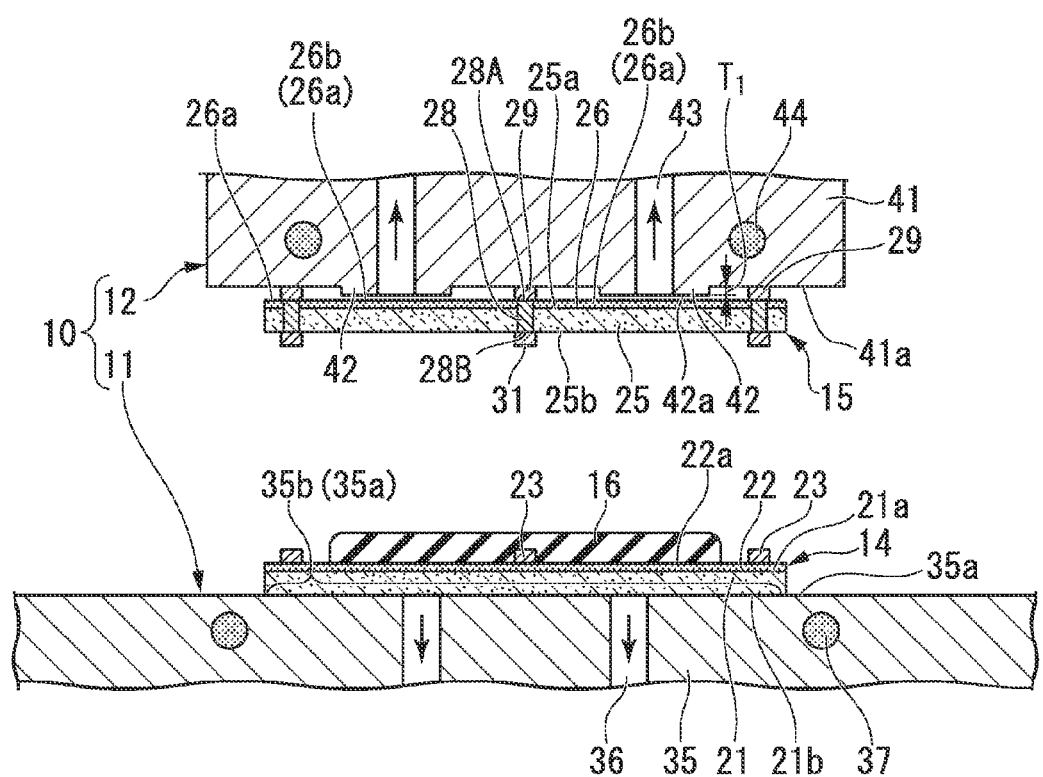
FIG. 1 is a fragmentary cross sectional elevation view of an apparatus for manufacturing a semiconductor device in accordance with a first embodiment of the present invention.

Before describing the present invention, the related art will be explained, in order to facilitate the understanding of the present invention.

A semiconductor chip that has through electrodes is thin, for example, 50 μm, and electrodes (bump electrodes) are formed on both surfaces thereof.

For this reason, in the case of using the vacuum chucking block noted in Patent Reference 1 to vacuum chuck the rear surface of the semiconductor chip, and to flip-chip mount the chip by pressing the semiconductor chip against the NCP that has been applied to an interconnect substrate, because of repulsion by the NCP, there is a problem of the semiconductor chip deforming (bowing) in a region in which the semiconductor chip electrodes are not formed, resulting in the chip cracking.

Although it is dependent upon the viscosity of the NCP, chip cracking occurs when the spacing between electrode groups is, for example, at a position greater than 3.3 mm.

Even if the vacuum chucking block noted in Japanese Patent Application Publication No. JPA 2005-191053 is applied to the vacuum chucking nozzle noted in v, because the constitution is not one in which there is direct pressure on the electrodes, it is not possible to improve the reliability of the connection between the electrodes provided on a semiconductor chip having through electrodes (a thin semiconductor chip) and the pad electrodes.

Also, with a semiconductor chip having through electrodes, when vacuum chucking the gaps between the electrodes and flip-chip mounting onto NCP applied to an interconnect substrate, in the outer periphery of the chip that is not pressed by the vacuum chucking tool, the repulsion of the NCP causes bowing of the semiconductor chip, and there is the problem of chip cracking occurring.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a method of manufacturing a semiconductor device may include, but is not limited to, the following processes. First and second semiconductor chips are prepared. The first semiconductor chip includes a first electrode on a first surface. The second semiconductor chip includes a second electrode on a second surface and a third electrode on a third surface that is opposite to the second surface. The third electrode is overlapped to the second electrode. The second surface includes an electrode-free region that is free of any electrode. A sealing resin is applied on the first surface of the first semiconductor chip. A second surface of the first semiconductor chip is held by a bonding tool including a pressing surface and a supporting-portion projected from the pressing surface. The pressing surface is in contact with the second electrode. The supporting-portion is arranged at a position facing the electrode-free region. The second semiconductor chip is stacked over the first semiconductor chip by the bonding tool so as to electrically connect the third electrode to the first electrode. The sealing resin is filled in a space between the first and second semiconductor chips. The sealing resin is hardened after stacking the second semiconductor chip on the first semiconductor chip. The first semiconductor chip, the second semiconductor chip and the sealing resin are disposed to form a stacked structure.

In some cases, the supporting-portion suppresses a deformation of the second semiconductor chip caused by a repulsion of the sealing resin, when the stacking the semiconductor chip on the first semiconductor chip by the bonding tool.

In some cases, a height of the projected supporting-portion of the bonding tool is smaller than that of the second electrode.

In some cases, the method may further include, but is not limited to, mounting the stacked structure over a wiring board so that the second surface of the second semiconductor chip faces the wiring board, after hardening the scaling resin between the first and second semiconductor chips.

In some cases, a width of the electrode-free region is more than 3.3 mm.

In some cases, the method may further include, but is not limited to, preparing a third semiconductor chip including a fourth electrode on a fourth surface and a fifth electrode on a fifth surface that is opposite to the fourth surface. The fifth electrode is overlapped to the fourth electrode. The fourth surface includes an electrode-free region that is free of any electrode. An additional sealing resin is applied on the second surface of the second semiconductor chip of the staked structure. A fourth surface of the third semiconductor chip is held by the bonding tool. The pressing surface is in contact with the fourth electrode. The supporting-portion is arranged at a position facing the electrode-free region of the third semiconductor chip. The third semiconductor chip is stacked over the second semiconductor chip by the bonding tool so as to electrically connect the fifth electrode to the second electrode. The additional sealing resin is filled in a space between the second and third semiconductor chips. There are hardened the sealing resin between the first and second semiconductor chips and the additional sealing resin between the second and third semiconductor chips.

In an embodiment, an apparatus for manufacturing a semiconductor device may include, but is not limited to, a bonding tool. The bonding tool may include, but is not limited to, a depressed pressing-portion, and a projected supporting-portion. The depressed pressing-portion has a pressing surface configured to press a first electrode on a first surface of a chip. The projected supporting-portion has a supporting surface adjacent to the pressing surface. The supporting surface is configured to support an electrode-free region of the first surface of the first chip. The electrode-free region is free of any electrode. The supporting surface is projected from the pressing surface.

In some cases, a difference in level between the supporting surface and the pressing surface is smaller than a dimension of the first electrode from the first surface of the chip.

In some cases, the supporting surface is a flat surface configured to face to the first surface of the chip.

In some cases, the apparatus may further include, but is not limited to, a stage configured to mount a substrate. The stage has at least a first absorption hole configured to absorb the substrate. The stage includes at least a first heater configured to heat the substrate.

In some cases, the projected supporting-portion has at least a second absorption hole configured to absorb the electrode-free region of the first surface of the chip.

In some cases, the bonding tool includes at least a second heater configured to heat the chip.

In another embodiment, a method of manufacturing a semiconductor device may include, but is not limited to, holding a chip on a bonding tool. The chip has first and second surfaces opposite to each other and at least a first electrode on the first surface and at least a second electrode on the second surface. The first surface has an electrode-free region that is free of any electrode. The bonding tool may include, but is not limited to, a depressed pressing-portion having a pressing surface configured to press the first electrode; and a projected supporting-portion having a supporting surface adjacent to the pressing surface. The supporting surface is configured to support the electrode-free region. The supporting surface is projected from the pressing surface.

In some cases, the method may further include, but is not limited to, holding a substrate on a stage, the substrate having an upper surface on which a third electrode is provided; applying a sealing resin on the upper surface of the substrate.

In some cases, the method may further include, but is not limited to, pressing the bonding tool to the substrate, so that the pressing surface presses the first electrode toward the substrate to bond the second electrode to the third electrode, while the pressing surface supporting the electrode-free region. The method may further include, but is not limited to, hardening the sealing resin after pressing the bonding tool to the substrate.

In some cases, the method may further include, but is not limited to, holding an additional chip on the bonding tool; applying an additional sealing resin on the chip bonded on the substrate; pressing the bonding tool to the additional chip to stack the additional chip on the chip over the substrate; and hardening the sealing resin between the chip and the substrate and the additional sealing resin between the additional chip and the chip.

In some cases, a difference in level between the supporting surface and the pressing surface is smaller than a dimension of the first electrode from the first surface of the chip.

In some cases, the supporting surface is a flat surface configured to face to the first surface of the chip.

In some cases, holding the chip on the bonding tool may include, but is not limited to, holding a chip that has a through electrode connecting the first and second electrode on the first and second surfaces respectively.

In some cases, the method may further include, but is not limited to, heating at least one of the substrate and the chip before and/or during pressing the bonding tool to the substrate.

In some cases, the method may further include, but is not limited to, using a wiring mother board having a plurality of wiring boards as the substrate.

In some cases, the method may further include, but is not limited to, using another chip as the substrate, so that the chip is bonded onto the other chip as the substrate.

In some cases, the method may further include, but is not limited to, using a mother board having a plurality of connected chips as the substrate.

In some cases, holding the chip on the bonding tool may include, but is not limited to, holding a chip that has a plurality of electrodes including the at least second electrode, the plurality of electrodes are arranged to be separated from each other, the electrode-free region isolating the plurality of electrodes from each other.

In some cases, holding the chip on the bonding tool may include, but is not limited to, holding a chip that has a plurality of electrodes including the at least second electrode, the plurality of electrodes is positioned in a center region of the chip, and the electrode-free region is positioned outside the center region.

In some cases, holding the chip on the bonding tool may include, but is not limited to, holding a chip that has a plurality of electrodes including the at least second electrode, the plurality of electrodes is positioned in a peripheral side region, and the electrode-free region is positioned inside the peripheral side region.

An embodiment that applies the present invention will be described in detail below, with references made to the drawings. The drawings used in the following description are for the purpose of describing a constitution of embodiments of the present invention, and the sizes, thicknesses, and dimensions and the like of the various parts shown therein may differ from the dimensional relationships in an actual semiconductor device.

First Embodiment

FIG. 1 is a cross-sectional view showing the general constitution of a semiconductor device manufacturing apparatus according to a first embodiment of the present invention. As a convenience in this description, FIG. 1 shows a first semiconductor chip 14 that is another semiconductor chip (substrate), a second semiconductor chip 15 that is semiconductor chip, and a sealing resin 16 that is made into the liquid state, which are not constituent elements of a semiconductor device manufacturing apparatus 10.

Also FIG. 1 shows schematically a condition in which a first electrode 23 provided on the first semiconductor chip 14 and a third electrode 31 provided on the second semiconductor chip 15 are in opposition.

Referring to FIG. 1, the semiconductor device manufacturing apparatus 10 of the first embodiment has a stage 11, a bonding tool 12, a pressing mechanism (not shown), and a bonding tool driving unit (not shown).

Before describing the specific constitution of the stage 11, the bonding tool 12, the pressing mechanism (not shown), and the bonding tool driving unit (not shown), as a convenience in this description, the first semiconductor chip 14 (substrate), which is mounted on the stage 11, the second semiconductor chip 15 (semiconductor chip), which is vacuum chucked to the bonding tool 12, and the sealing resin 16 will be described.

Referring to FIG. 1, the first semiconductor chip 14 has a semiconductor substrate 21, an element layer 22, and the first electrodes 23. As the semiconductor substrate 21, for example, a silicon substrate made by separation into separate pieces from a silicon wafer can be used.

The element layer 22 is provided on the front surface 21a of the semiconductor substrate 21. The element layer 22 has a transistor element that is not illustrated and is constituted by a plurality of stacked insulating layers, and interconnects, contact plugs, and the like, which are provided in the plurality of insulating layers (all not shown).

The above-noted interconnects and contact plugs are electrically connected to the transistor element (not shown). The contact plugs disposed on the uppermost layer are exposed from the front surface 22a (main surface of the substrate) of the element layer 22.

The plurality of first electrodes 23 are provided on the front surface 22a of the element layer 22 and are connected to the contact plugs that are disposed on the uppermost layer. By doing this, the first electrodes 23 are electrically connected to the transistor elements (not shown). The first electrodes 23 are for external connections and can be, for example, bumps.

The first semiconductor chip 14 has three electrode groups (three row electrode groups) that are a plurality of first electrodes 23 arranged in rows. Two electrode groups of the three electrode groups are in opposition on the outer periphery of an element layer 26 in a spaced arrangement, and one electrode group is sandwiched between the two electrode groups so as to be disposed in the center part of the element layer 26. The three electrode groups are disposed so as to extend in the same direction. The three electrode groups are also in a sufficiently spaced-apart arrangement.

A memory semiconductor chip, for example, can be used as the first semiconductor chip 14 constituted as noted above.

Referring to FIG. 1, the second semiconductor chip 15 has a semiconductor substrate 25, the element layer 26, through electrodes 28, second electrodes 29 and the third electrodes 31.

As the semiconductor substrate 25, for example, a silicon substrate made from a chipped silicon wafer in a small piece can be used.

The element layer 26 is provided on a front surface 25a of the semiconductor substrate 25. A front surface 26a of the element layer 26 (first surface of a semiconductor chip) is a surface on which the second electrodes 29 are formed. Of the front surface 26a of the element layer 26, an electrode-free surface 26b is disposed in a part positioned between the electrode groups.

The element layer 26 has transistor elements that are not illustrated, and is constituted by a plurality of stacked insulating layers and interconnects, contact plugs, and the like (all not shown), which are provided in the plurality of insulating layers. The above-noted interconnects and contact plugs are electrically connected to the transistor elements (not shown).

The through electrodes 28 are TSVs (through silicon vias), which are provided so as to pass through the semiconductor substrate 25 and the element layer 26 with an intervening insulating film (that is, a film for electrically insulating the semiconductor substrate 25 and through electrode 28) that is not illustrated.

The through electrodes 28, in a condition in which the first semiconductor chip 14 and the second semiconductor chip 15 are brought into opposition (that is, in the condition shown in FIG. 1), are disposed so as to oppose the first electrodes 23 provided in the first semiconductor chip 14. That is, the second semiconductor substrate 15 has a plurality of through electrode groups that are rows made of three through electrodes 28. The through electrode groups of three rows are disposed in a sufficiently spaced condition.

One end 28A of a through electrode 28 is exposed from the front surface 26a of the element layer 26. The other end 28B of the through electrode 28 is exposed from a rear surface 25b (second surface of the semiconductor chip) of the semiconductor substrate 25.

The through electrodes 28 are connected to a plurality of interconnects provided in the insulating layers (not shown) that constitute the element layer 26. By doing this, the through electrodes 28 are electrically connected to transistor elements (not shown).

A plurality of second electrodes 29 are provided on the front surface 26a of the element layer 26 so as to be connected to the one ends 28A of the through electrodes 28. By doing this, the second semiconductor substrate 15 has electrode groups of three rows made of the plurality of the second electrodes 29. The electrode groups of three rows are in a sufficiently spaced arrangement.

The second electrode 29 is an electrode for external connection, protruding from the front surface 26a of the element layer 26. A bump, for example, can be used as the second electrode 29. Regarding the front surface 26a of the element layer 26 as a reference, the height of the second electrode 29 can be, for example, 20 μm.

A plurality of third electrodes 31 are provided on the rear surface 25b of the semiconductor substrate 25 with an intervening insulating film (that is, a film for the purpose of electrically insulating between the semiconductor substrate 25 and the third electrode 31) that is not illustrated in drawings, so as to connect to the other ends 28B of the through electrodes 28.

By doing this, the third electrodes 31 are electrically connected to the second electrodes 29 via the through electrodes 28, and are disposed so as to oppose the second electrodes 29 via the semiconductor substrate 25 and the element layer 26.

The third electrodes 31 protrude from the rear surface 25b of the semiconductor substrate 25 and are electrodes for external connections that are connected to the first electrodes 23 provided in the first semiconductor chip 14. Bumps, for example, can be used as the third electrodes 31.

The second semiconductor chip 15 having the above-noted constitution has the through electrodes 28 and is a chip that is made thin (for example, with a thickness of 50 μm or less). A memory semiconductor chip or interface semiconductor chip, for example, can be used as the second semiconductor chip 15.

The sealing resin 16 is a non-conductive liquid-state sealing resin having flowability (that is, a sealing resin before being completely cured), which is disposed on the front surface 22a of the element layer 22. The sealing resin 16 is a resin for sealing between the first semiconductor chip 14 and the second semiconductor chip 15 by filling the gap therebetween when the third electrodes 31 provided on the second semiconductor chip 15 are electrically connected to the first electrodes 23 provided on the first semiconductor chip 14. An NCP (non-conductive paste), for example, can be used as the sealing resin 16.

A constitution may be used in which a film resin such as an NCF (non-conductive film) is disposed on the first semiconductor chip and is caused to melt, and the gap between the first semiconductor chip 14 and the second semiconductor chip 15 being filled therewith.

The stage 11, the bonding tool 12, the pressing mechanism (not shown), and the bonding tool driving unit (not shown), which constitute the semiconductor device manufacturing apparatus 10 of the first embodiment, will be described.

Referring to FIG. 1, the stage 11 has a stage body 35, first vacuum chucking holes 36, and first heating mechanisms 37.

The stage body 35 is a member having a flat upper surface on which the first semiconductor chip 14 is placed. The upper surface 35a of the stage body 35 has a substrate placement surface 35b on which the first semiconductor chip 14 is stacked.

A plurality of first vacuum chucking holes 36 are provided in the stage body 35 so as to be exposed to the substrate placement surface 35b, these being connected to a vacuum pump that is not illustrated in drawings, thereby vacuum chucking the first semiconductor chip 14 to fix the position thereof.

The first heating mechanisms 37 are provided within the stage body 35 and heat the first semiconductor chip 14 that is vacuum chucked onto the stage body 35 to a prescribed temperature. A cartridge heater, for example, can be used as the first heating mechanisms 37.

The bonding tool 12 has a tool body 41, a support 42, second vacuum chucking holes 43, and second heating mechanisms 44.

The tool body 41 is substantially square column shape. The outer shape of the tool body 41 is constituted so as to be larger than that of the second semiconductor chip 15.

The tool body 41 has a flat pressure surface 41a opposing the second electrodes 29. The pressure surface 41a makes contact with the upper ends of a plurality of second electrodes 29 when the bonding tool 12 vacuum chucks the second semiconductor chip 15. The pressure surface 41a moves the bonding tool 12 below from the condition shown in FIG. 1, and, after coming into contact with the second semiconductor chip 15 and the sealing resin 16, presses the upper ends of the second electrodes 29.

The support 42 is provided at a part of the tool body 41 that opposes the electrode-free surface 26b that is positioned between electrode groups constituted by the plurality of second electrodes 29. The support 42 is integrally constituted together with the tool body 41, and protrudes from the pressure surface 41a toward the second semiconductor chip 15 (the electrode-free surface 26b) side. The support 42 has a flat supporting surface 42a opposing the electrode-free surface 26b, and supports the electrode-free surface 26b by the flat supporting surface 42a.

With the pressure surface 41a as a reference, the protruding amount $T_1$ of the support 42 (in other words, the distance from the pressure surface 41a to the supporting surface 42a) is preferably smaller than the height value of the second electrode 29.

Specifically, when taking the front surface 26a of the element layer 26 as a reference in the case in which the height of the second electrode 29 is 20 μm, the protruding amount $T_1$ of the support 42 can be, for example, 17 μm. In other words, a protruding amount $T_1$ of the support 42 is preferably approximately 3 μm smaller than the height value of the second electrode 29.

By doing this, when taking the pressure surface 41a as a reference by making smaller the protruding amount $T_1$ of the support 42 smaller than the value of height of the second electrode 29, even if there is variation in the heights among the plurality of second electrodes 29, it is possible to press reliably all of the upper ends of the second electrodes 29 by the pressure surface 41a.

As described above, because the constitution is such that the protruding amount $T_1$ of the support 42 is made to be smaller than the value of height of the second electrode 29, the bonding tool 12 vacuum chucks the second semiconductor chip 15 and, under the condition in which the second semiconductor chip 15 is picked up (condition shown in FIG. 1), a gap is formed between the supporting surface 42a and the front surface 26a of the element layer 26.

From the condition shown in FIG. 1, the bonding tool 12 is caused to move beneath, so as to press the second electrodes 29 by the pressure surface 41a, and when the first electrodes 23 are electrically connected to the third electrodes 31, the supporting surface 42a of the support 42 makes contact with the electrode-free surface 26b of the element layer 26 on the second semiconductor chip 15 that attempts to deform (bow) by the repulsion of the sealing resin 16.

By doing this, because it is possible to suppress the deformation of the second semiconductor chip 15 caused by the repulsion of the sealing resin 16, it is possible to suppress the occurrence of chip cracking in the second semiconductor chip 15, which is a thin sheet.

A plurality of second vacuum chucking holes 43 are provided in the tool body 41 so as to pass through the support 42 and be exposed from the supporting surface 42a. The second vacuum chucking holes 43 are connected to a vacuum pump (not shown), vacuum chucking the electrode-free surface 26b so as to enable the bonding tool 12 to pick up the second semiconductor chip 15.

The second heating mechanisms 44 are provided within the tool body 41, heating the second semiconductor chip 15 that is vacuum chucked by the bonding tool 12 to a prescribed temperature. A cartridge heater, for example, can be used as the second heating mechanism 44.

A pressing mechanism (not shown) is a mechanism for the purpose of pressing the second electrodes 29 by the pressure surface 41a, by pressing the tool body 41 to the stage 11 side.

A bonding tool driving unit (not shown) is a driving part for the purpose of moving the bonding tool 12 in the parallel planar direction and in upward and directions with respect to the upper surface 35a of the stage body 35.

A semiconductor device manufacturing apparatus of the first embodiment providing the bonding tool 12 having the tool body 41 that includes a pressure surface 41a that makes contact with the second electrodes 29 provided on the second semiconductor chip 15 and that presses the second electrodes 29; and the support 42 provided on the tool body 41 disposed at the pressure surface 41a side thereof, protruding from the pressure surface 41a toward the first semiconductor chip 14 side, and supporting the electrode-free surface 26b on which the second electrodes 29 are not formed on the second semiconductor chip 15, thereby enabling the second electrodes 29 to be directly pressed by the pressure surface 41a. By doing this, it is possible to reliably electrically connect the first electrodes 23 and the third electrodes 31 and to improve the electrical connection reliability between the first semiconductor chip 14 and the second semiconductor chip 15. Additionally, when the liquid-state sealing resin 16 is repulsed by pressure from the second semiconductor chip 15, the electrode-free surface 26b of the second semiconductor chip 15 that attempts to deform (bow) is brought into contact with the support 42 (specifically, the flat supporting surface 42a), thereby enabling suppression of the deformation of the second semiconductor chip 15, so that it is possible to suppress the occurrence of chip cracking in the second semiconductor chip 15 that is made thin (for example, with a thickness of 50 µm or less).

Figure 2:
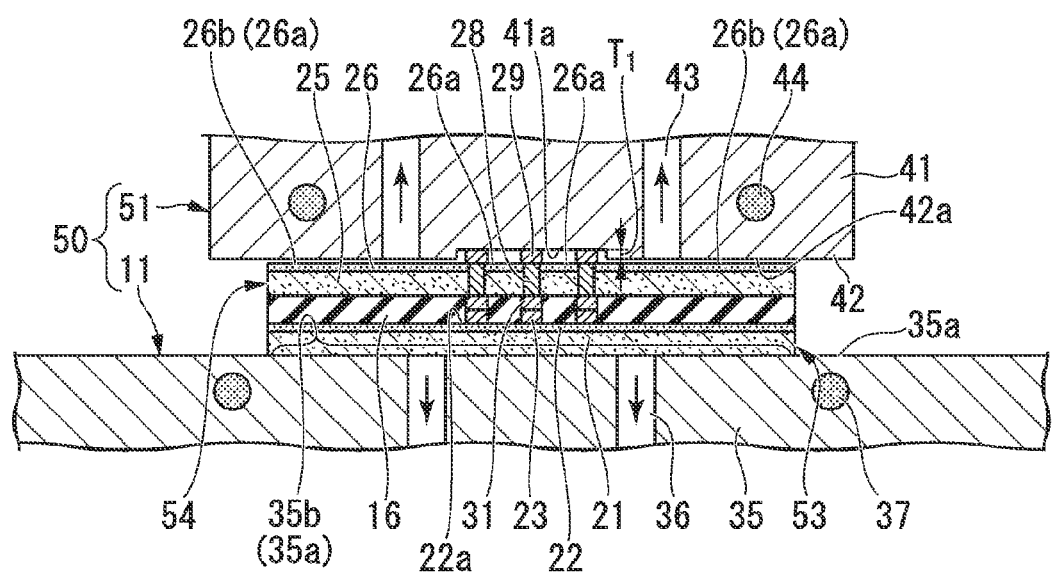
FIG. 2 is a fragmentary cross sectional elevation view of an apparatus for manufacturing a semiconductor device in accordance with a first modification to the first embodiment of the present invention.

FIG. 2 is a cross-sectional view showing the general constitution of a semiconductor device manufacturing apparatus according to a first variant example of the first embodiment of the present invention. As a convenience in this description, FIG. 2 shows a first semiconductor chip 53, which is another semiconductor chip (substrate) of the first variant example according to the first embodiment, a second semiconductor chip 54 that is a semiconductor chip, and a sealing resin 16 that is made into the liquid-state, which are not constituent elements of the semiconductor device manufacturing apparatus 50.

Also, FIG. 2 shows schematically a condition in which a first electrode 23 provided on the first semiconductor chip 53, and the third electrodes 31 provided on the second semiconductor chip 54 are connected.

In FIG. 2, the same reference numerals are assigned to constituent parts similar to those of the semiconductor device manufacturing apparatus 10 of the first embodiment shown in FIG. 1.

Referring to FIG. 2, except for providing a bonding tool 51 instead of the bonding tool 12 that is provided in the semiconductor device manufacturing apparatus 10 of the first embodiment, the semiconductor device manufacturing apparatus 50 according to the first variant example of the first embodiment has a constitution similar to that of the semiconductor device manufacturing apparatus 10.

As a convenience in this description, before describing the constitution of the bonding tool 51, the constitutions of the first semiconductor chip 53 which is vacuum chucked by the stage 11 and the second semiconductor chip 54 which is vacuum chucked by the bonding tool 51 will be described.

Referring to FIG. 2, with the exception of the groups of a plurality of first electrodes 23 provided in three rows in the first semiconductor chip 14 shown in FIG. 1 being collectively disposed in the center part on the front surface 22a of the element layer 22, the first semiconductor chip 53 has a constitution that is similar to that of the first semiconductor chip 14. A memory semiconductor chip, for example, can be used as the first semiconductor chip 53.

Referring to FIG. 2, with the exception of disposing the through electrodes 28, the second electrodes 29 and the third electrodes 31 that are provided in the second semiconductor chip 15 shown in FIG. 1, described previously, in a shape of three rows so as to oppose the first electrode 23 provided on the first semiconductor chip 53, and for disposing the electrode-free surface 26b so as to sandwich the three row groups of electrodes constituted by the second electrodes 29, the second semiconductor chip 54 has a constitution similar to that of the second semiconductor chip 15. A memory semiconductor chip or an interface semiconductor chip, for example, can be used as the second semiconductor chip 54.

Referring to FIG. 2, with the exception of disposing the support 42 that constitutes the bonding tool 12 shown in FIG. 1, described previously, so as to sandwich the three row electrode groups constituted by a plurality of second electrodes 29, the bonding tool 51 has a constitution similar to that of the bonding tool 12.

When the first electrodes 23 and the third electrodes 31 are caused to be electrically connected by disposing the supporting surface 42a of the support 42 provided on the bonding tool 51 on the front surface 22a of the element layer 22, and by pressing the second semiconductor chip 54 onto the liquid-state sealing resin 16, deformation of the second semiconductor chip 54 that attempts to deform (bow) by repulsion of the liquid-state sealing resin 16 is suppressed.

The semiconductor device manufacturing apparatus 50 according to the first variant example of the first embodiment having the above-noted constitution can achieve an effect similar to that of the semiconductor device manufacturing apparatus 10 of the first embodiment.

Specifically, by directly pressing the second electrode 29 with the pressure surface 41a, it is possible to reliably electrically connect the first electrodes 23 and the third electrodes 31 and to improve the electrical connection reliability between the first semiconductor chip 53 and the second semiconductor chip 54. Additionally, when the sealing resin 16 that is made into the liquid state is repulsed by pressure from the second semiconductor chip 54, the electrode-free surface 26b of the second semiconductor chip 54 that attempts to deform (bow) is brought into contact with the support 42 (specifically, the flat supporting surface 42a), thereby enabling suppression of the deformation of the second semiconductor chip 54, so that it is possible to suppress the occurrence of chip cracking in the second semiconductor chip 54 that is made thin (for example, with a thickness of 50 µm or less).

Because the constitution is also such that the supporting surface of 42a of the support 42 provided on the bonding tool 51 can make contact with the electrode-free surface 26b positioned at the outer peripheral edge, deformation of the outer peripheral edge of the second semiconductor chip 54 can be suppressed.

Figure 3:
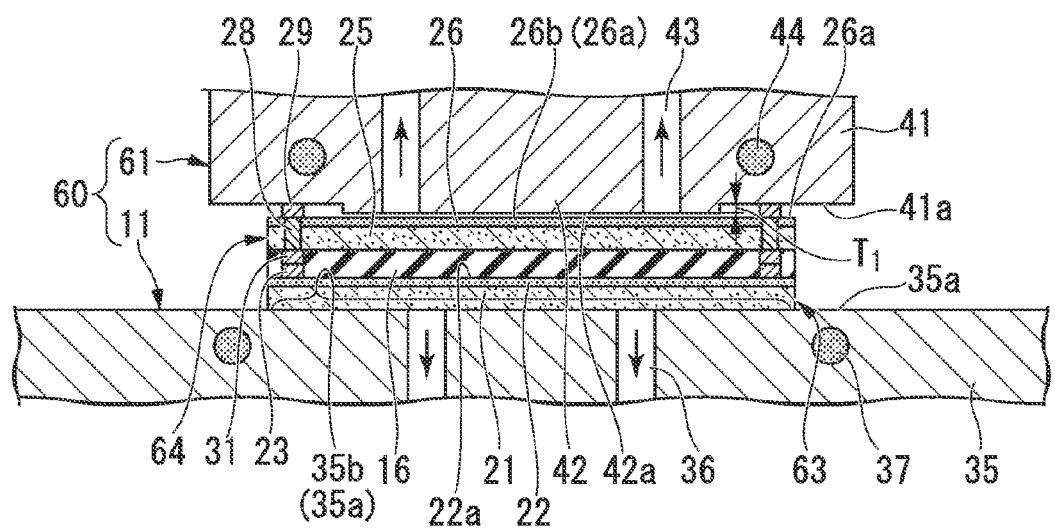
FIG. 3 is a fragmentary cross sectional elevation view of an apparatus for manufacturing a semiconductor device in accordance with a second modification to the first embodiment of the present invention.

FIG. 3 is a cross-sectional view showing the general constitution of a semiconductor device manufacturing apparatus according to a second variant example of the first embodiment of the present invention. As a convenience in this description, FIG. 3 shows a first semiconductor chip 63, which is another semiconductor chip (substrate), a second semiconductor chip 64 that is a semiconductor chip, and a sealing resin 16 that is made in the liquid state, which are not constituent elements of the device manufacturing apparatus 60 according to the first variant example of the first embodiment.

Also, FIG. 3 shows schematically a condition in which the first electrodes 23 provided on the first semiconductor chip 63 and the third electrodes 31 provided on the second semiconductor chip 54 are connected.

In FIG. 3, the same reference numerals are assigned to constituent parts similar to those of the semiconductor device manufacturing apparatus 10 of the first embodiment shown in FIG. 1.

Referring to FIG. 3, except for providing a bonding tool 61 instead of the bonding tool 12 that is provided in the semiconductor device manufacturing apparatus 10 of the first embodiment, the semiconductor device manufacturing apparatus 60 according to the second variant example of the first embodiment has a constitution similar to that of the semiconductor device manufacturing apparatus 10.

As a convenience in this description, before describing the constitution of the bonding tool 61, the first semiconductor chip 63 which is vacuum chucked by the bonding tool 61 and the second semiconductor chip 64 which is vacuum chucked by the stage 11 will be described.

Referring to FIG. 3, with the exception of disposing the plurality of first electrodes which are provided in the first semiconductor chip 14 shown in FIG. 1 so as to be arranged along two opposing sides of the rectangular-shaped first semiconductor chip 63, the first semiconductor chip 63 has a constitution that is similar to that of the first semiconductor chip 14. A memory semiconductor chip, for example, can be used as the first semiconductor chip 63.

Referring to FIG. 3, with the exception of disposing the through electrodes 28, the second electrodes 29 and the third electrodes 31 that are provided on the second semiconductor chip 15 shown in FIG. 1, described previously, as two rows opposing the first electrodes 23 provided on the first semiconductor chip 63, and for disposing the electrode-free surface 26b making contact with the supporting portion 42 between the two row electrode groups made of the plurality of second electrodes 29, the second semiconductor chip 64 has a constitution similar to that of the second semiconductor chip 15. A memory semiconductor chip or an interface semiconductor chip, for example, can be used as the second semiconductor chip 64.

Referring to FIG. 3, with the exception of disposing the support 42 that constitutes the bonding tool 12 shown in FIG. 1, described previously, between the two row electrode groups made of a plurality of second electrodes 29, the bonding tool 61 has a constitution similar to that of the bonding tool 12.

When the first electrodes 23 and the third electrodes 31 are caused to be electrically connected by disposing the supporting surface 42a of the support 42 provided on the bonding tool 61 on the front surface 22a of the element layer 22, and by pressing the second semiconductor chip 64 onto the liquid-state sealing resin 16, deformation of the second semiconductor chip 64 that attempts to deform (bow) by repulsion of the liquid-state sealing resin 16 is suppressed.

The semiconductor device manufacturing apparatus 60 according to the second variant example of the first embodiment having the above-noted constitution can achieve an effect similar to that of the semiconductor device manufacturing apparatus 10 of the first embodiment.

Specifically, by securely pressing the second electrodes 29 with the pressure surface 41a, it is possible to improve the electrical connection reliability between the third electrodes 31 and the first electrodes 23, the supporting surface 42a of the support 42, which makes contact with the electrode-free surface 26b of the element layer 26 on the second semiconductor chip 64 that attempts to deform by repulsion of the sealing resin 16 that is made in the liquid state, suppress deformation of the second semiconductor chip 64, thereby enabling suppression to occur the chip cracking in the second semiconductor chip 64 that is made thin (for example, with a thickness of 50 µm or less).

Figure 19:
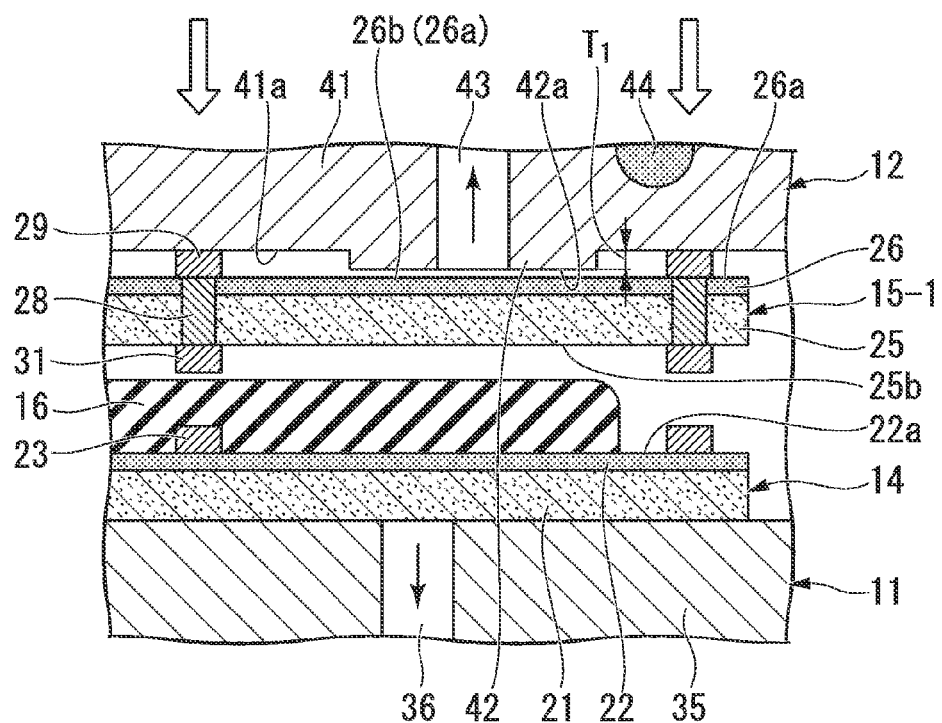
FIG. 19 is a fragmentary cross sectional elevation view of a first process for phenomenon occurring in the semiconductor device in the step of FIG. 6.
Figure 20:
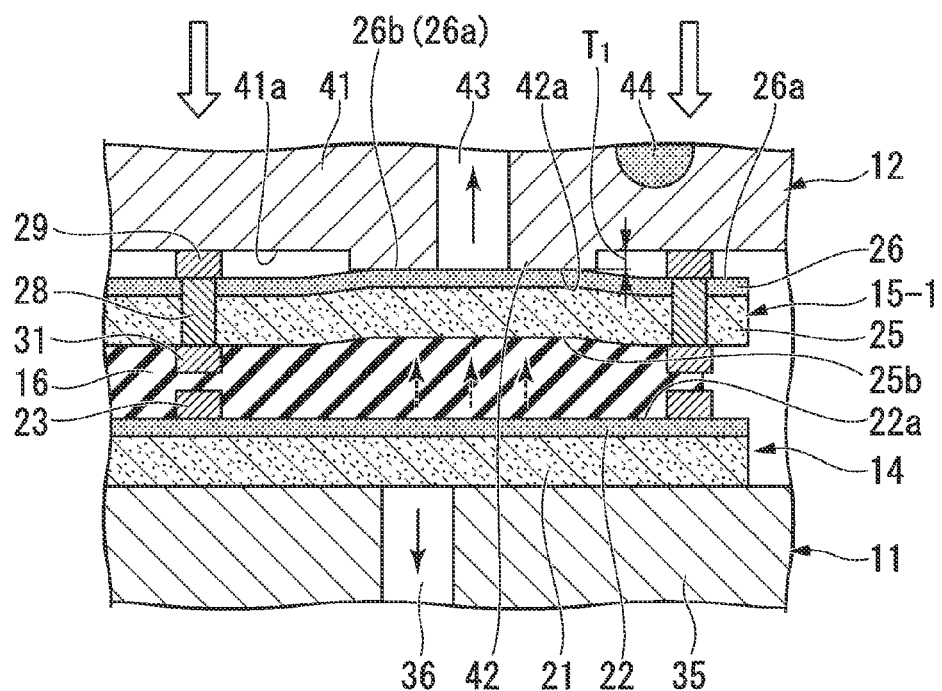
FIG. 20 is a fragmentary cross sectional elevation view of a second process for the phenomenon occurring subsequent to the process of FIG. 19, in the semiconductor device in the step of FIG. 6.
Figure 21:
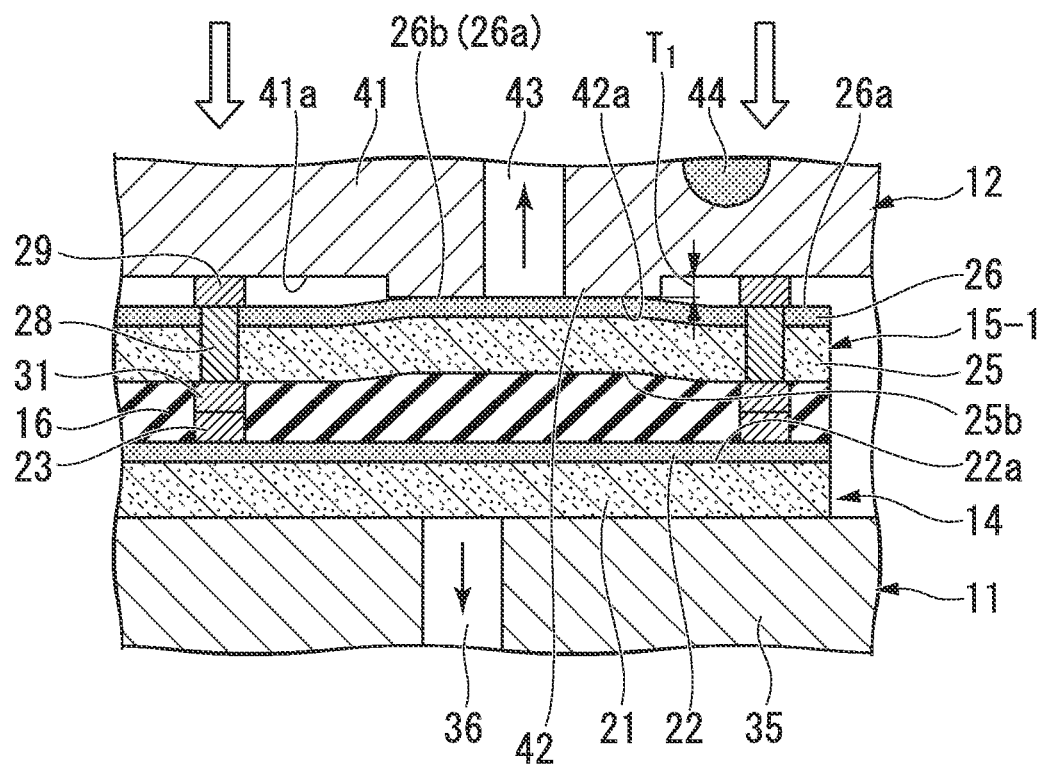
FIG. 21 is a fragmentary cross sectional elevation view of a second process for the phenomenon occurring subsequent to the process of FIG. 20, in the semiconductor device in the step of FIG. 6.

FIG. 4 to FIG. 18 are cross-sectional views showing manufacturing process steps for a semiconductor device according to the first embodiment of the present invention. FIG. 19 to FIG. 21 are cross-sectional views showing the step-by-step phenomena in the process steps shown in FIG. 6, and are enlarged cross-sectional views of the region A shown in FIG. 6. In FIG. 4 to FIG. 21, parts of similar structures as the structures shown in FIG. 1 are assigned the same reference numerals.

Referring to FIG. 4 to FIG. 21, a method for manufacturing a semiconductor device 100 (refer to FIG. 18) according to the first embodiment of the present invention using the semiconductor device manufacturing apparatus 10 shown in FIG. 1 will be described.

Figure 4:
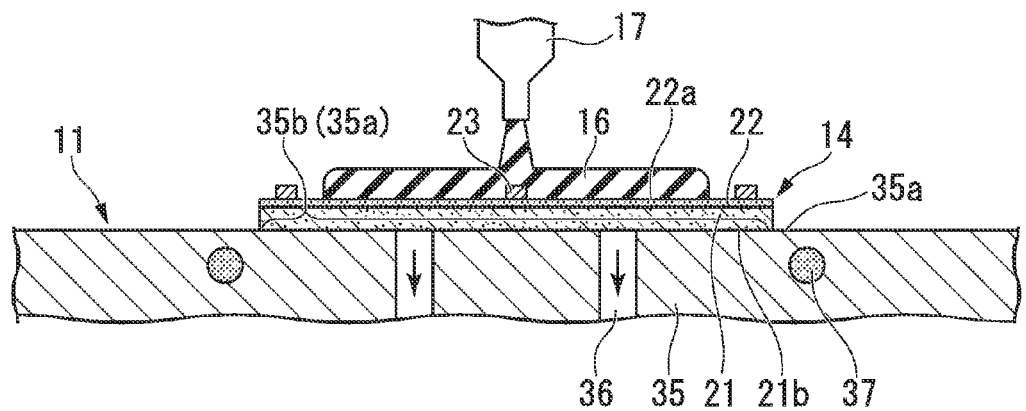
FIG. 4 is a fragmentary cross sectional elevation view of a step involved in a method of manufacturing a semiconductor device using the apparatus of FIG. 1.
Figure 9:
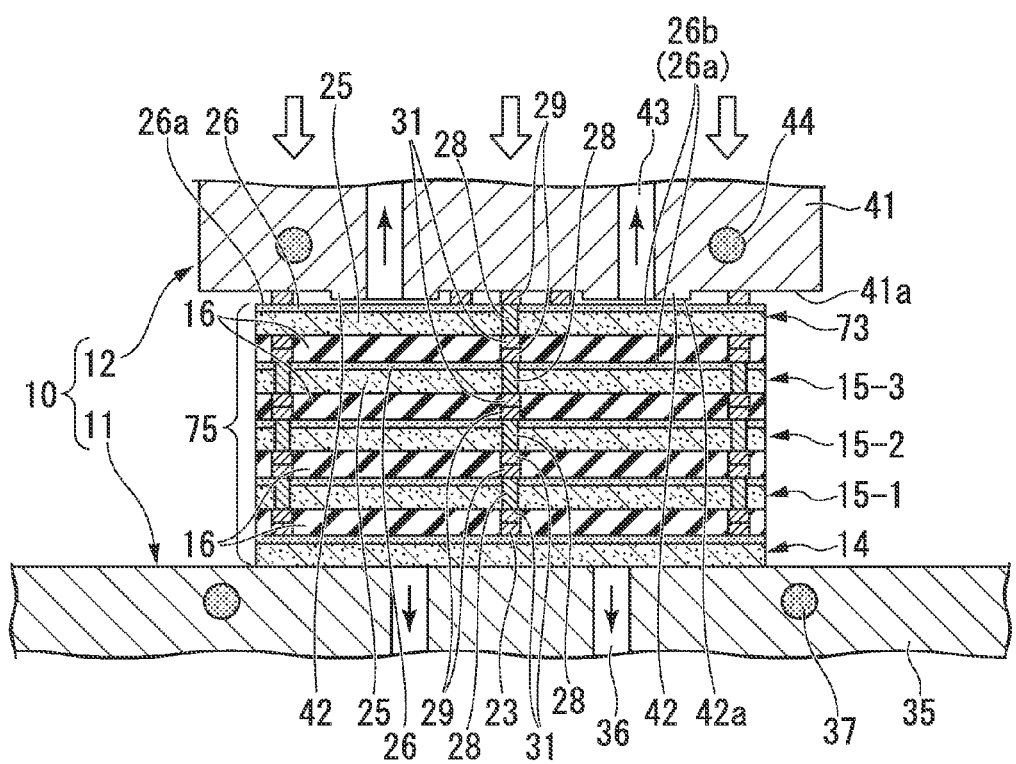
FIG. 9 is a fragmentary cross sectional elevation view of a step, subsequent to the step of FIG. 8, involved in a method of manufacturing a semiconductor device using the apparatus of FIG. 1.

First, before performing a process step shown in FIG. 4, a first semiconductor chip 14 (another semiconductor chip (substrate)), and second semiconductor chips 15-1, 15-2, 15-3 and 73 (a plurality of semiconductor chips) are prepared beforehand, as shown in FIG. 9.

Specifically, as the first semiconductor chip 14, a first semiconductor chip 14 (memory semiconductor chip) having the constitution shown in FIG. 1 described previously is prepared.

As the second semiconductor chips 15-1, 15-2, 15-3, the memory semiconductor chips that have a constitution similar to that of the second semiconductor chip 15 shown in FIG. 1 described previously are prepared. That is, the second semiconductor chips 15-1, 15-2, 15-3 have through electrodes 28, which are made thin (for example, with a thickness of 50 µm or less).

As the second semiconductor chip 73, an interface semiconductor chip that has a constitution similar to that of the semiconductor chip 15 shown in FIG. 1 described previously is prepared. The second semiconductor chip 73 is electrically connected (by flip-chip connection) to an interconnect substrate 80 shown in FIG. 12, which will be described later. The second electrodes 29 provided on the second semiconductor chip 73 are disposed so as to oppose pad electrodes 84 provided on the interconnect substrate 80 shown in FIG. 12.

Next, in the process step shown in FIG. 4, the first semiconductor chip 14 is stacked onto the substrate placement surface 35b of the stage body 35 and the first vacuum chucking holes 36 vacuum chuck the rear surface 21b of the semiconductor substrate 21, thereby fixing the position of the first semiconductor chip 14.

When this is done, because no electrodes (bumps) are formed on the rear surface 21b of the semiconductor substrate 21, vacuum suction with a good condition can be performed to the stage body 35.

Next, the first heating mechanisms 37 heat and maintain the first semiconductor chip 14 to a prescribed temperature (for example, 80 to 100° C.).

Next, a dispenser 71 disposes the liquid-state sealing resin 16 onto the front surface 22a of the element layer 22. At this stage, the sealing resin 16 is not hardened. An NCP (non-conductive paste), for example, can be used as the sealing resin 16.

Figure 5:
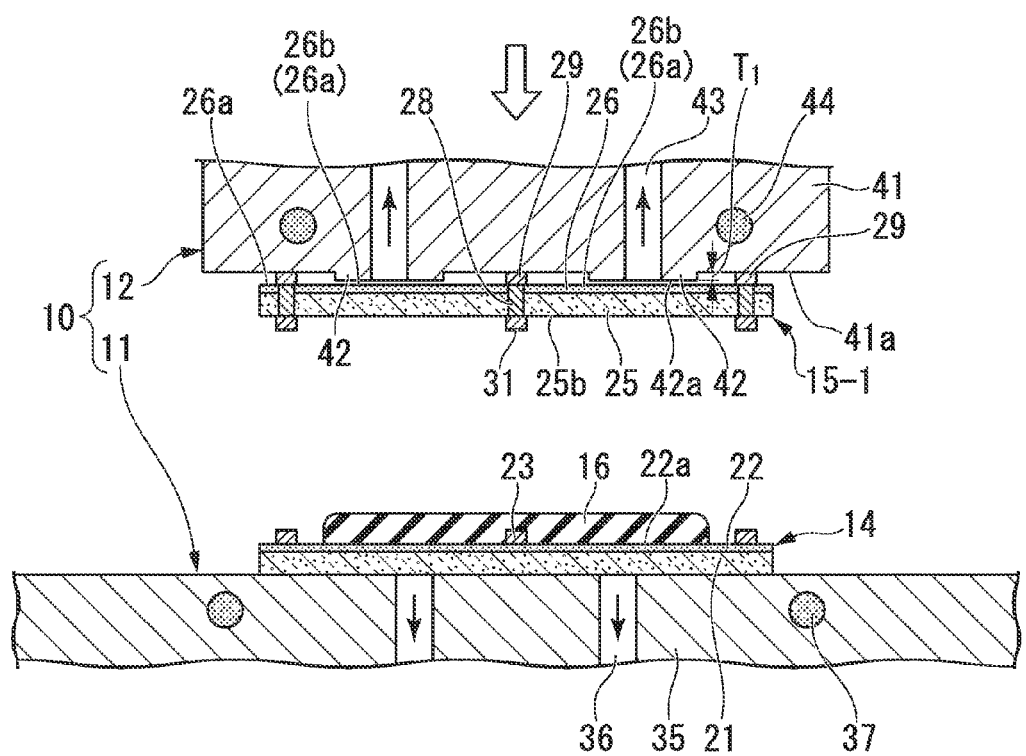
FIG. 5 is a fragmentary cross sectional elevation view of a step, subsequent to the step of FIG. 4, involved in a method of manufacturing a semiconductor device using the apparatus of FIG. 1.

In the process step shown in FIG. 5, the second vacuum chucking holes 43 in the bonding tool 12 vacuum chuck the electrode-free surface 26b of the second semiconductor chip 15-1 and also the second heating mechanisms 44 heat to and maintain the second semiconductor chip 15-1 at a prescribed temperature (for example, 200° C.).

At this stage, the pressure surface 41a makes contact with the upper end of the second electrodes 29, and also the supporting surface 42a of the support 42 does not make contact with the electrode-free surface 26b.

The second semiconductor chip 15-1 that is vacuum chucked by the bonding tool 12 is placed above the first semiconductor chip 14 so that the third electrodes 31 oppose the first electrodes 23.

Figure 6:
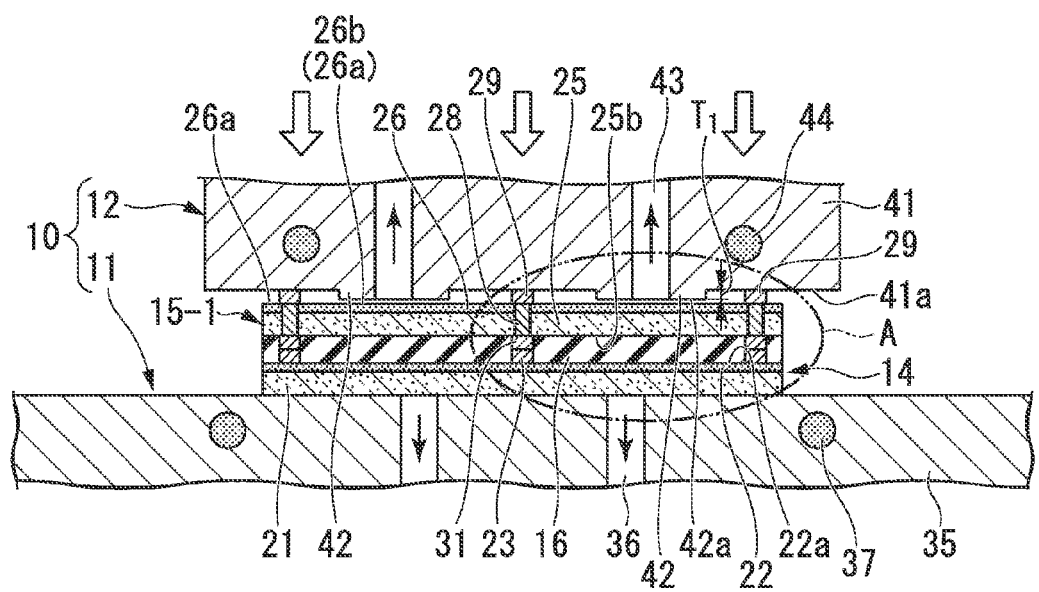
FIG. 6 is a fragmentary cross sectional elevation view of a step, subsequent to the step of FIG. 5, involved in a method of manufacturing a semiconductor device using the apparatus of FIG. 1.

In the process step shown in FIG. 6, from the condition shown in FIG. 5, the bonding tool 12 is caused to move beneath, so as to make contact with the second semiconductor chip 15-1 and the sealing resin 16 that is made into the liquid state. Next, the pressure surface 41a of the bonding tool 12 presses the second electrodes 29, and hot-press bonding electrically connects the first electrodes 23 and the third electrodes 31, and also the sealing resin 16 fills and seals the spacing between the first semiconductor chip 14 and the second semiconductor chip 15-1, to temporally attach by pressure the second semiconductor chip 15-1 onto the first semiconductor chip 14.

By doing this, the first semiconductor chip 14 and the second semiconductor chip 15-1 are electrically connected.

Referring to FIG. 19 to FIG. 21, in the step-by-step description of phenomena in the process step shown in FIG. 6, the functions and effects of the support 42 provided on the bonding tool 12 will be described.

As shown in FIG. 19, at the stage before the third electrodes 31 and the rear surface 25b of the semiconductor substrate 25 make contact with the sealing resin 16, contact between the pressure surface 41a and the upper ends of the second electrodes 29 occurs and also contact between the front surface 26a of the element layer 26 and the supporting surface 42a of the support 42 does not occur yet.

At this stage, the first and second semiconductor chips 14, 15-1 are heated to and maintained at prescribed temperatures, respectively.

Next, as shown in FIG. 20, at the stage in which the pressure surface 41a presses the second electrodes 29 and the third electrodes 31 and the rear surface 25b of the semiconductor substrate 25 makes contact with the sealing resin 16 that is made into in the liquid state, the liquid-state sealing resin 16 spreads in the horizontal direction, repulsing in the upward direction (in the direction from the first semiconductor chip 14 towards the second semiconductor chip 15-1), and the second semiconductor substrate 15-1 that is made thin attempts to deform (bow).

When this occurs, the supporting surface 42a of the support 42 provided on the bonding tool 12 and the front surface 26a of the element layer 26 that constitutes the second semiconductor chip 15-1 that attempts to deform are brought into contact.

Next, as shown in FIG. 21, when the second electrodes 29 are further pressed from the stage shown in FIG. 20, hot-press bonding electrically connects the first electrodes 23 and the third electrodes 31, and also the sealing resin 16 that is made in the liquid state fills the space between the first semiconductor chip 14 and the second semiconductor chip 15-1.

When this is done, because the contact condition between the supporting surface 42a and the front surface 26a of the element layer 26 is maintained, repulsion caused by the liquid-state sealing resin 16 suppresses the deformation of the second semiconductor chip 15-1.

As described above, the semiconductor device manufacturing apparatus 10, which has the pressure surface 41a pressing the second electrodes 29; and the support 42 that protrudes from the pressure surface 41a to the first semiconductor chip 14 side and that supports the electrode-free surface 26b of the second semiconductor chip 15-1, picks up the second semiconductor chip 15-1 so as to bring the first electrodes 23 and the third electrodes 31 into opposition, after which it brings into contact the sealing resin 16 that is made into the liquid state and the second semiconductor chip 15-1, pressing against the second electrodes 29 by the pressure surface 41a to hot-press bond the first electrodes 23 and the third electrodes 31 and also fills the gaps formed between the first semiconductor chip 14 and the second semiconductor chip 15-1 with the liquid-state sealing resin 16, with the pressure surface 41a pressing the second electrodes 29. By doing this, it is possible to reliably electrically connect the first electrodes 23 and the third electrodes 31 and to improve the electrical connection reliability between the first semiconductor chip 14 and the second semiconductor chip 15-1. Additionally, when the sealing resin 16 that is made into the liquid state is repulsed by pressure from the second semiconductor chip 15-1, the electrode-free surface 26b of the second semiconductor chip 15-1 that attempts to deform (bow) is brought into contact with the flat supporting surface 42a of the support 42, thereby enabling suppression of the deformation of the second semiconductor chip 15-1, so that it is possible to suppress the occurrence of chip cracking in the second semiconductor chip 15-1 that is made thin (for example, with a thickness of 50 μm or less).

Because the semiconductor device manufacturing apparatus 10 is constituted so as to make the protruding amount $T_1$ of the support 42 smaller than value of height of the second electrode 29 (for example, approximately 3 μm smaller), even in the case of taking the pressure surface 41a as a reference, even if there is variation in the heights among the plurality of second electrodes 29, it is possible to securely press the upper ends thereof by the pressure surface 41a to reliably connect between the first electrodes 23 and the third electrodes 31, thereby enabling improvement of the electrical connection reliability between the first electrodes 23 and the third electrodes 31.

Additionally, comparing with the above case in which, after mounting the second semiconductor chip 15-1 onto the first semiconductor chip 14, (that is, in other words, after pressure bonding the first electrodes 23 and the third electrodes 31), the underfilling resin is filled into the gaps between the first semiconductor chip 14 and the second semiconductor chip 15-1 by capillary action, it is possible to reduce the manufacturing time of the semiconductor device 100, thereby enabling improvement of the productivity of the semiconductor device 100.

Moreover, after causing the disposition of the sealing resin 16 that was made into the liquid state onto the front surface 22a of the element layer 22, the second semiconductor chip 15-1 is pressed against the liquid-state sealing resin 16 so as to seal the gaps between the first semiconductor chip 14 and the second semiconductor chip 15-1, because there is no formation of a fillet part that occurs in the case in which the underfilling resin is used, it is possible to improve the outer dimensional accuracy of a chip lamination 75 (refer to FIG. 10, described later), which is constituted by a plurality of laminated semiconductor chips (specifically, the first and second semiconductor chips 14, 15-1, 15-2, 15-3, 73).

Figure 7:
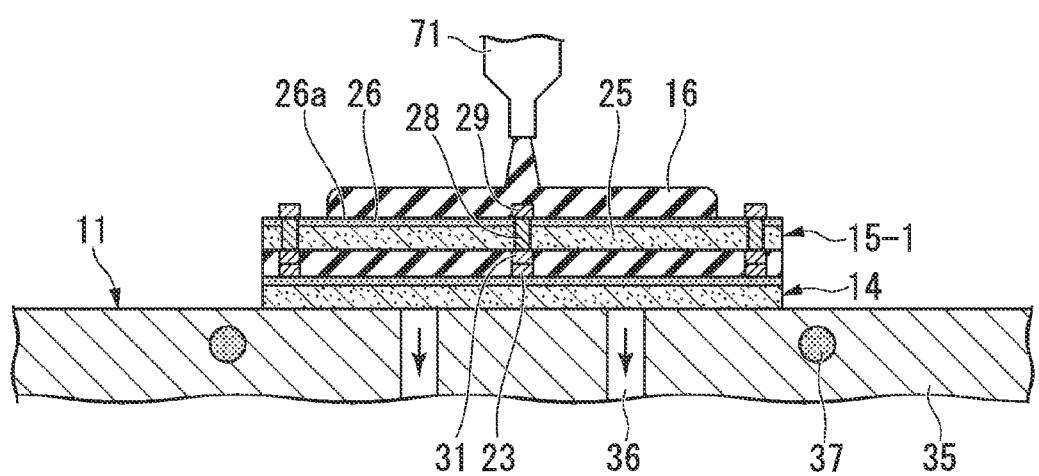
FIG. 7 is a fragmentary cross sectional elevation view of a step, subsequent to the step of FIG. 6, involved in a method of manufacturing a semiconductor device using the apparatus of FIG. 1.

Next, in the process step shown in FIG. 7, the dispenser 71 disposes the liquid-state sealing resin 16 onto the front surface 26a of the element layer 26 of the second semiconductor chip 15-1. At this stage, the sealing resin 16 has not been cured.

Figure 8:
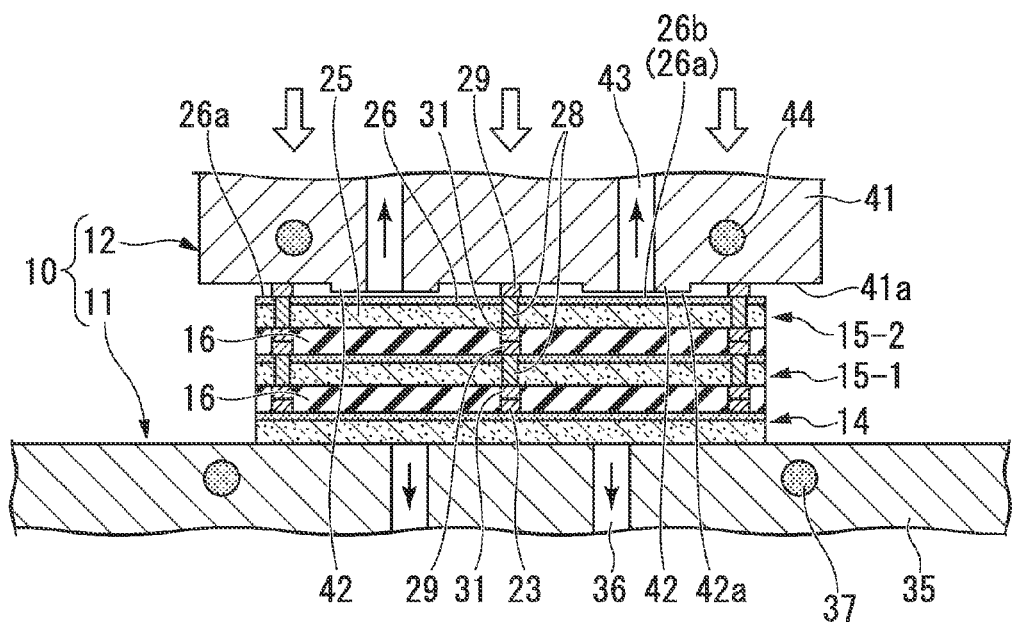
FIG. 8 is a fragmentary cross sectional elevation view of a step, subsequent to the step of FIG. 7, involved in a method of manufacturing a semiconductor device using the apparatus of FIG. 1.

Next, in the process step shown in FIG. 8, by performing process steps similar to those shown in FIG. 5 and FIG. 6 described previously, the heated second semiconductor chip 15-2 presses against the liquid-state sealing resin 16 disposed onto the heated second semiconductor chip 15-1, and, by hot-press bonding, an electrical connection is made between the second electrodes 29 provided on the second semiconductor chip 15-1 and the third electrodes 31 provided on the second semiconductor chip 15-2, and additionally the liquid-state sealing resin 16 fills the spaces formed between the second semiconductor chip 15-1 and the second semiconductor chip 15-2.

By doing this, the second semiconductor chip 15-1 and the second semiconductor chip 15-2 are electrically connected and the second semiconductor chip 15-2 is temporally attached by pressure onto the first semiconductor chip 15-1.

Next, in the process step shown in FIG. 9, by performing process steps similar to those shown in FIG. 7 and FIG. 8 described previously, by hot-press bonding, an electrical connection is made between the second electrodes 29 provided on the second semiconductor chip 15-2 and the third electrodes 31 provided on the second semiconductor chip 15-3, and additionally the liquid-state sealing resin 16 seals the spaces formed between the second semiconductor chip 15-2 and the second semiconductor chip 15-3.

By doing this, the second semiconductor chip 15-2 and the second semiconductor chip 15-3 are temporally attached by pressure and electrically connected therebetween.

Next, by performing process steps similar to those shown in FIG. 7 and FIG. 8 described previous, by hot-press bonding, an electrical connection is made between the second electrodes 29 provided on the second semiconductor chip 15-3 and the third electrodes 31 provided on the second semiconductor chip 73 (semiconductor chip heated at 200° C.), and additionally the liquid-state sealing resin 16 seals the spaces formed between the second semiconductor chip 15-3 and the second semiconductor chip 73.

By doing this, the second semiconductor chip 15-3 and the second semiconductor chip 73 are temporally attached by pressure and electrically connected therebetween.

After that, under a condition in which the temporally attached second semiconductor chip 73 is heated to 300° C., a load is applied so as to perform final bonding between the first and second semiconductor chips 14, 15-1, 15-2, 15-3, 73. By doing this, the sealing resin 16 that has been made into the liquid state is completely hardened.

By doing this, a chip lamination 75 made from the stacked first and second semiconductor chips 14, 15-1, 15-2, 15-3, 73, and the cured sealing resin 16 is formed.

Figure 10:
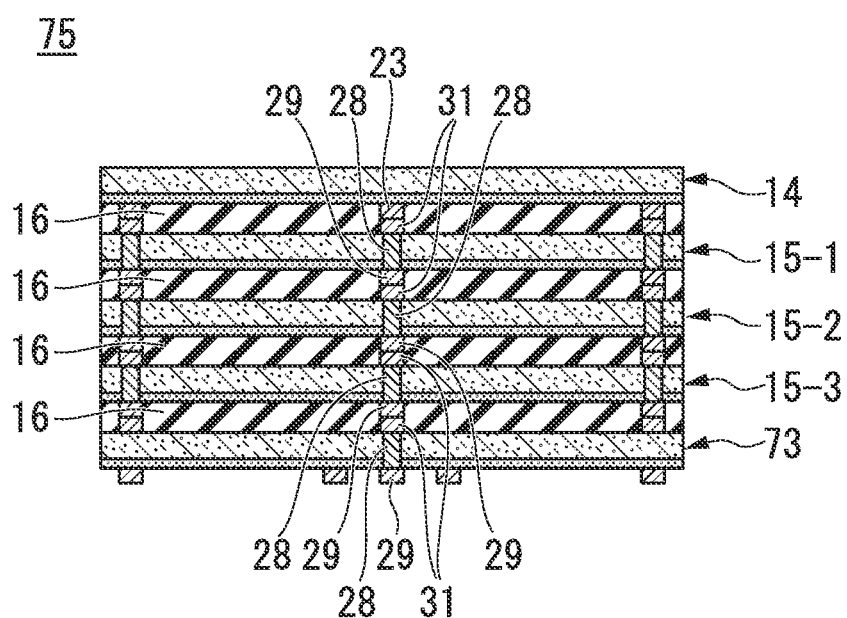
FIG. 10 is a fragmentary cross sectional elevation view of a step, subsequent to the step of FIG. 9, involved in a method of manufacturing a semiconductor device using the apparatus of FIG. 1.

Next, in the process step shown in FIG. 10, the chip lamination 75 is removed from the semiconductor device manufacturing apparatus 10 shown in FIG. 9 and is turned upside-down. Next, in the process step shown in FIG. 11, an interconnect motherboard 81 is prepared.

The constitution of the interconnect motherboard 81 will be described, with references made to FIG. 11.

Figure 11:
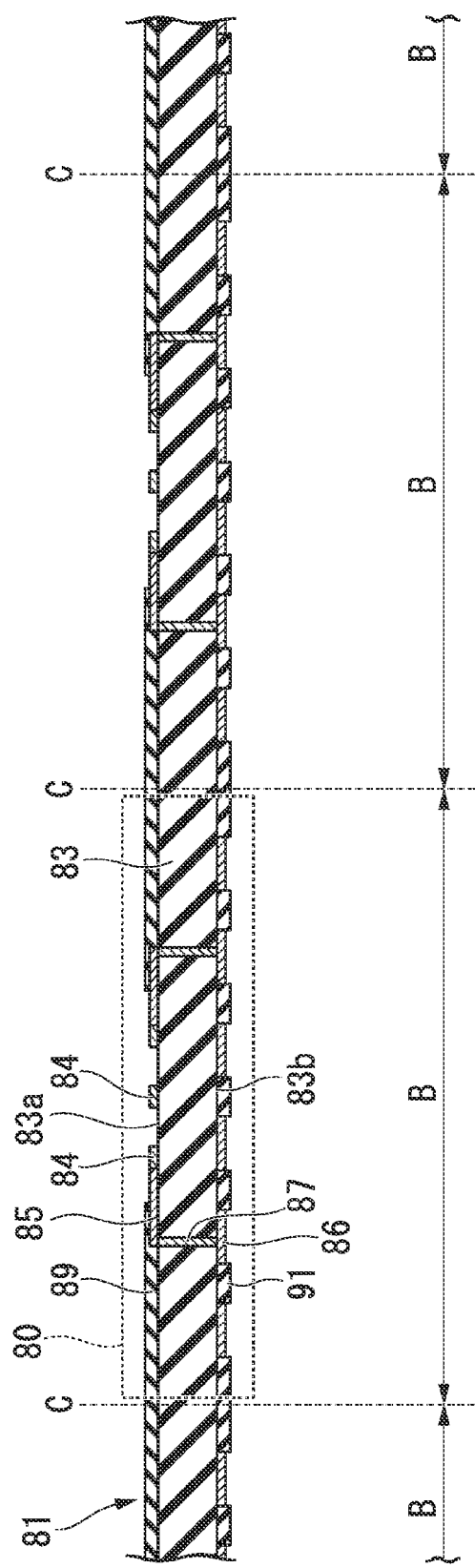
FIG. 11 is a fragmentary cross sectional elevation view of a step, subsequent to the step of FIG. 10, involved in a method of manufacturing a semiconductor device using the apparatus of FIG. 1.

Referring to FIG. 11, the interconnect motherboard 81 is constituted by linking a plurality of interconnect substrates 80 having main substrates 83, pad electrodes 84, an interconnect pattern 85, land parts 86, through electrodes 87, first solder resists 89, and second solder resists 91.

The main substrate 83 is partitioned by the dicing lines C, and includes a plurality of interconnect substrate formation regions B in which the interconnect substrates 80 are formed. A fiberglass epoxy resin board, for example, can be used as the main substrate 83. The pad electrodes 84 of the front surface 83a of the main substrate 83, are provided on the center part of the interconnect substrate formation region B. The pad electrodes 84 are electrodes that are brought into connection with the second electrodes 29 provided on the second semiconductor chip 73 of the chip lamination 75 shown in FIG. 10.

The interconnect pattern 85 is integrally constituted with the pad electrodes 84, and is provided on the front surface 83a of the main substrate 83 corresponding to the interconnect substrate formation region B. The interconnect pattern 85 is a pattern for re-interconnection.

The land parts 86 are provided on the rear surface 83b of the main substrate 83 corresponding to the interconnect substrate formation region B.

The through electrodes 87 are provided so as to pass through the main substrate 83 corresponding to the interconnect substrate formation region B. The upper edges of the through electrodes 87 connect to the interconnect pattern 85, and the lower edge thereof connect to the land part 86. By doing this, the through electrodes 87 make electrically connection between the land parts 86 and pad electrodes 84.

The first solder resists 89 are provided on the front surface 83a of the main substrate 83 corresponding to the interconnect substrate formation region B and the dicing line C so as to expose the pad electrodes 84. The first solder resist 89 is provided to cover a part of the interconnect pattern 85, and has a function of protecting the interconnect pattern 85.

The second solder resists 91 are provided on the rear surface 83b of the main substrate 83 corresponding to the interconnect substrate formation region B and the dicing line C so as to expose the land part 86.

The interconnect substrate 80 is constituted by the pad electrodes 84, the interconnect pattern 85, the land parts 86, the through electrodes 87, the main substrate 83 corresponding to the interconnect substrate formation region B, the first solder resists 89 and second solder resists 91.

Figure 12:
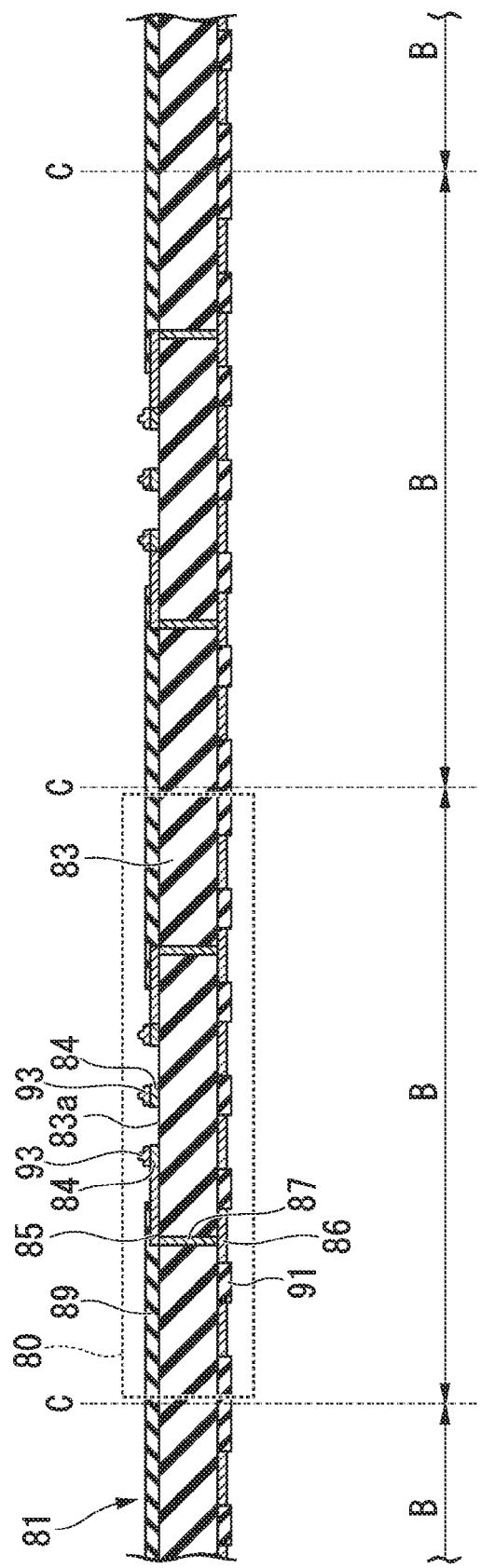
FIG. 12 is a fragmentary cross sectional elevation view of a step, subsequent to the step of FIG. 11, involved in a method of manufacturing a semiconductor device using the apparatus of FIG. 1.

Next, in the process step shown in FIG. 12, wire bumps 93 are formed on the pad electrodes 84.

Specifically, the wire bumps 93 are formed, for example, by using a wire bonding apparatus (not shown) to perform ultrasonic bonding of balls fused to press the ends of wires made of gold, copper, or the like onto the pad electrodes 84, after which the rear ends of the wires are pulled to cut them.

Figure 13:
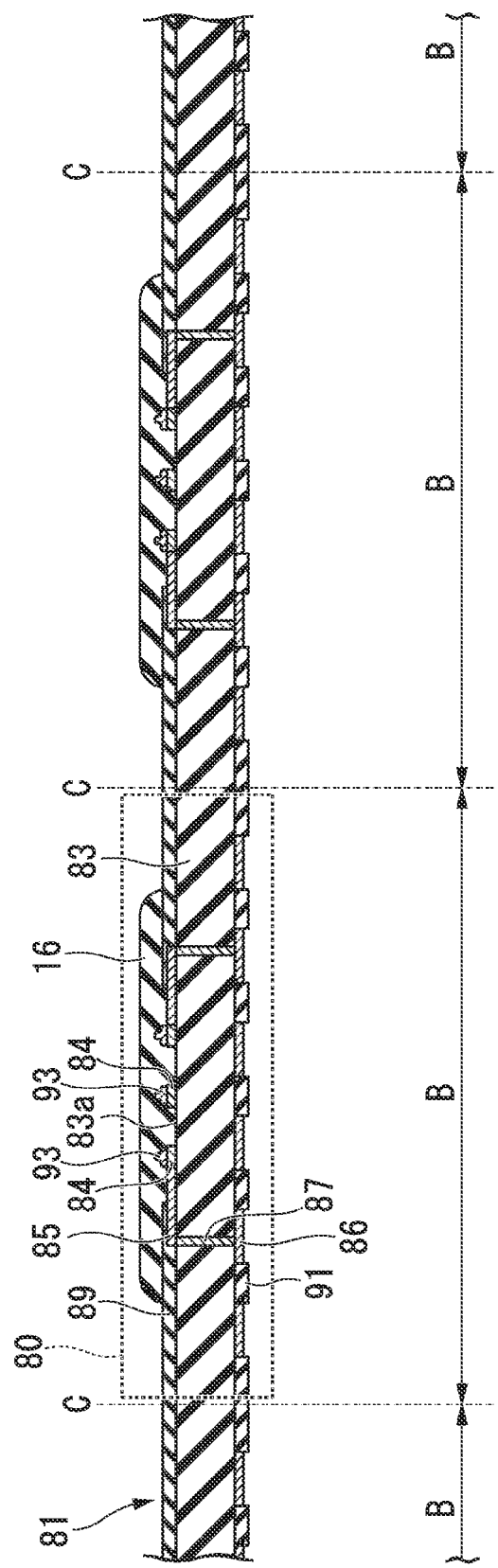
FIG. 13 is a fragmentary cross sectional elevation view of a step, subsequent to the step of FIG. 12, involved in a method of manufacturing a semiconductor device using the apparatus of FIG. 1.

Next, in the process step shown in FIG. 13, the sealing resin 16 that is made into the liquid state is disposed onto the center part of the each of the interconnect substrate formation regions B so as to cover the wire bumps 93.

Specifically, the liquefied sealing resin 16, in the similar manner to that shown in FIG. 4 described previously, is formed by a dispenser (not shown) that supplies a liquefied NCP.

Figure 14:
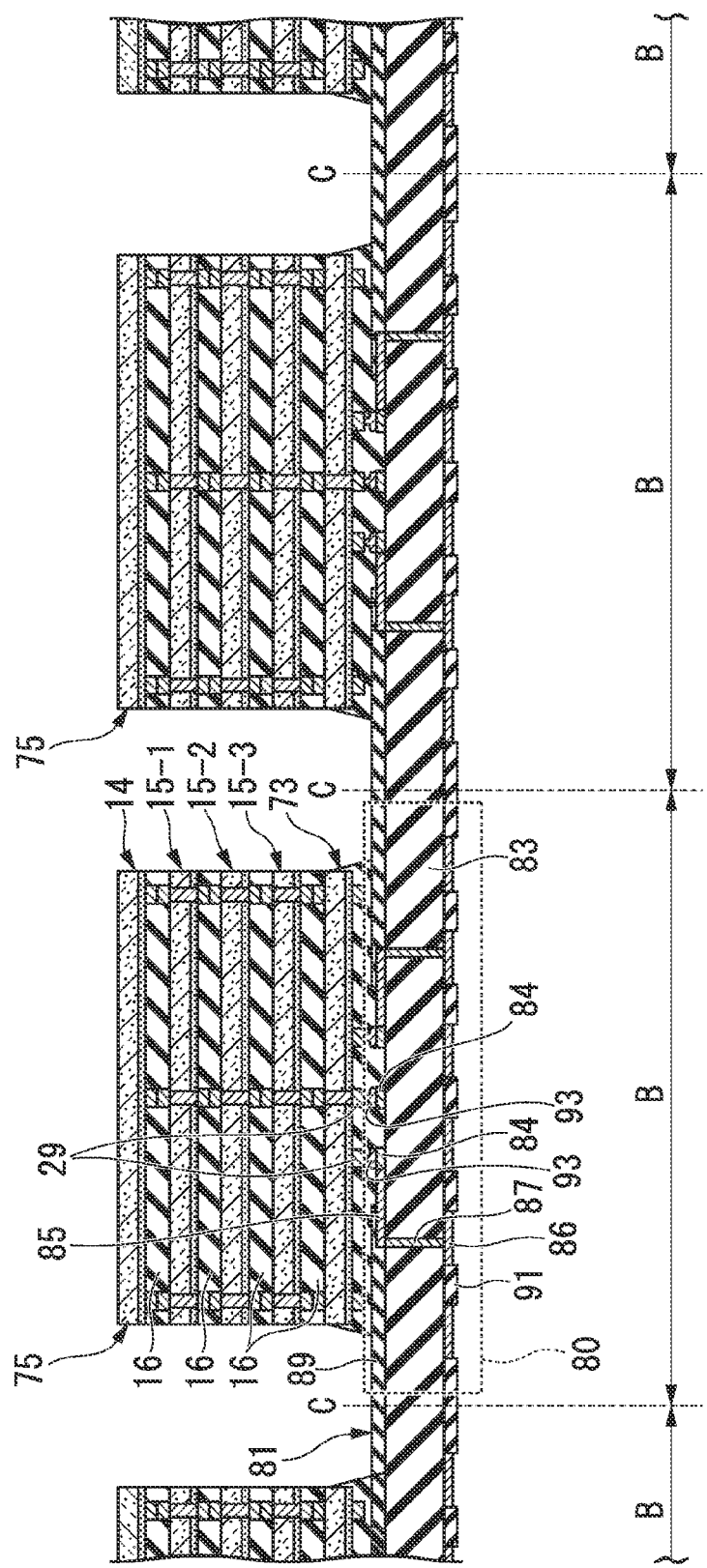
FIG. 14 is a fragmentary cross sectional elevation view of a step, subsequent to the step of FIG. 13, involved in a method of manufacturing a semiconductor device using the apparatus of FIG. 1.

Next, in the process step shown in FIG. 14, a bonding tool (not shown) is used to pick up the chip lamination 75 shown in FIG. 10 to bring the second electrodes 29 provided on semiconductor chips 73 of chip lamination 75 and the pad electrodes 84 provided on the interconnect substrate 80 into opposition.

Next, in the condition of the bonding tool (not shown) heating the chip lamination 75 to a high temperature (for example, approximately 300° C.), a sealing resin 16 is formed, and by also pressing the chip laminations 75 to the heated interconnect substrates 80, the second bump electrodes 29 provided on the second semiconductor chip 73 and the pad electrodes 84 provided on the interconnect substrate 80 are hot-press bonded via the wire bumps 93, and also the sealing resin 16 seals the gaps formed between the chip lamination 75 and the interconnect substrates 80.

By doing this, the chip lamination 75 is flip-chip connected to the interconnect substrate 80, and an electrical connection is also made therebetween.

In the process step shown in FIG. 14, the chip laminations 75 are mounted with respect to all of the interconnect substrates 80.

Figure 15:
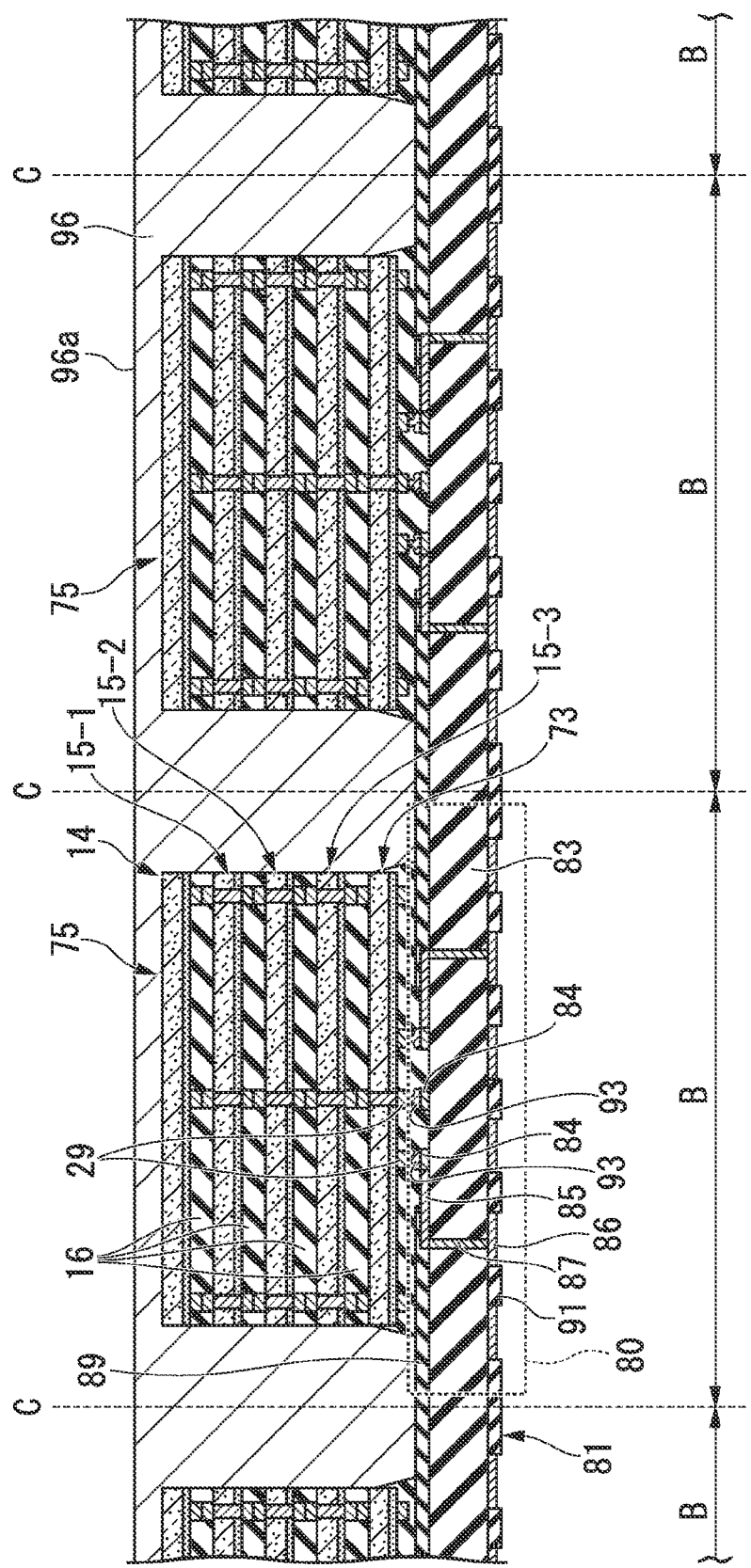
FIG. 15 is a fragmentary cross sectional elevation view of a step, subsequent to the step of FIG. 14, involved in a method of manufacturing a semiconductor device using the apparatus of FIG. 1.

Next, in the process step shown in FIG. 15, a plurality of chip laminations 75 mounted on the interconnect motherboard 81 are batch sealed, a molding resin 96 that has a flat upper surface 96*a* being formed. The molding resin 96 is formed using the transfer molding method.

Specifically, a structure shown in FIG. 14 is housed within the cavity space formed between an upper mold and a lower mold, after which the molding resin 96 heated to melting is poured into the cavity space. Next, the melted molding resin 96 is heated (cured) to a prescribed temperature (for example, approximately 180° C.) and then, by baking it at a prescribed temperature, the molding resin 96 is caused to harden completely.

By doing this, the molding resin 96 that batch seals a plurality of chip laminations 75 is formed.

A thermally cured resin, such as an epoxy resin, is used as the molding resin 96.

Figure 16:
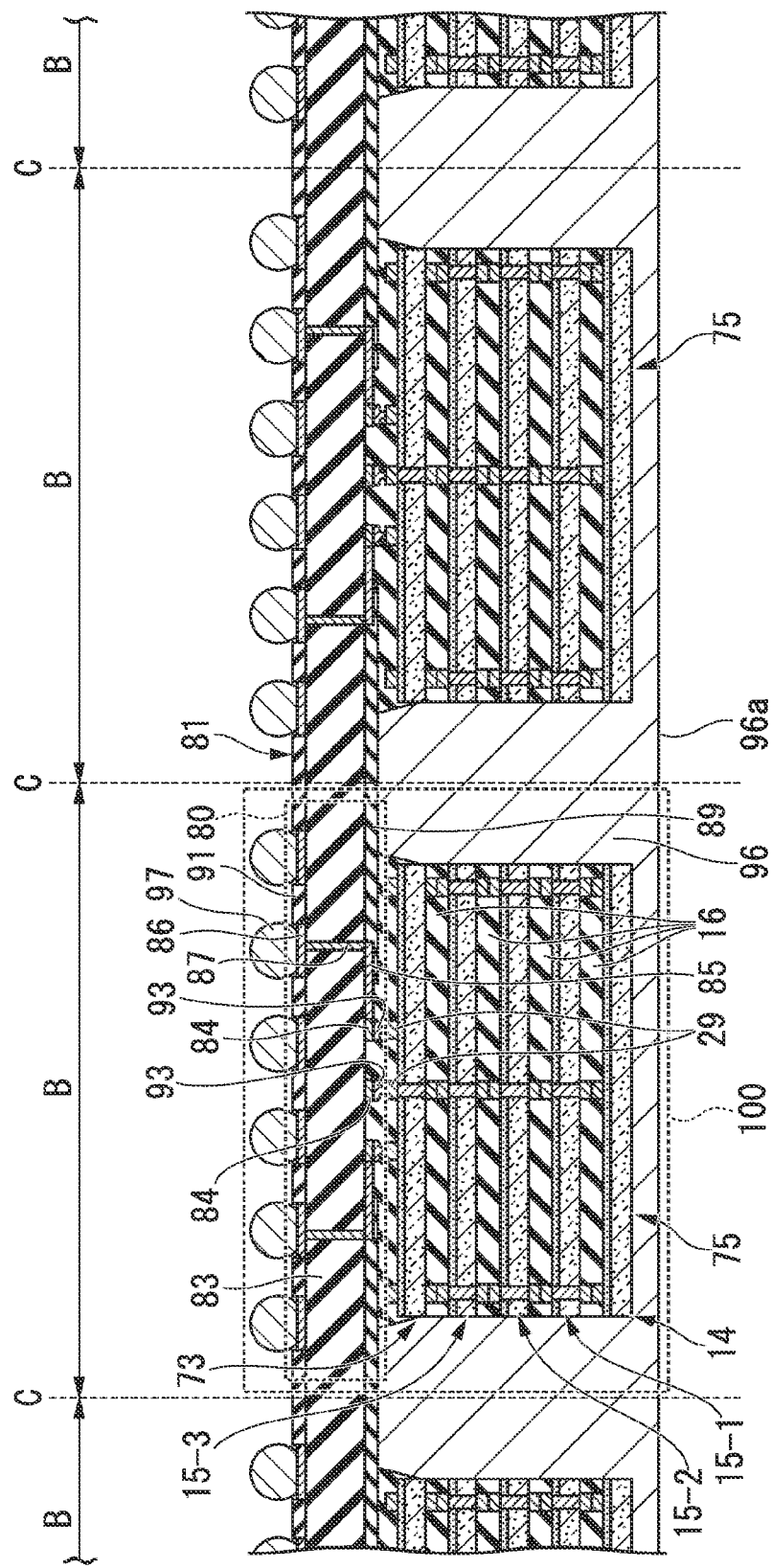
FIG. 16 is a fragmentary cross sectional elevation view of a step, subsequent to the step of FIG. 15, involved in a method of manufacturing a semiconductor device using the apparatus of FIG. 1.

Next, in the process step shown in FIG. 16, the structure shown in FIG. 15 is turned upside-down, after which external connection terminals 97 are formed on a plurality of land parts 86 that are formed on the interconnect motherboard 81. By doing this, a plurality of semiconductor devices 100 having the interconnect substrates 80, the chip laminations 75, the sealing resins 16, the molding resins 96, and the external connection terminals 97, and that are linked are formed. Solder balls are, for example, used as the external connection terminals 97.

In this case, a mounting tool of a ball mounter having a plurality of vacuum holes (not shown in drawings) is used to chuck and hold a plurality of solder balls, while flux is transferred and formed onto the plurality of solder balls.

Next, the solder balls are placed onto a plurality of land parts 86 that are formed on the interconnect motherboard 81. After that, the interconnect motherboard 81 on which the solder bolls are formed is heated (reflowed). By doing this, the solder balls are fixed onto the land parts 86 provided on a plurality of interconnect substrates 80.

Figure 17:
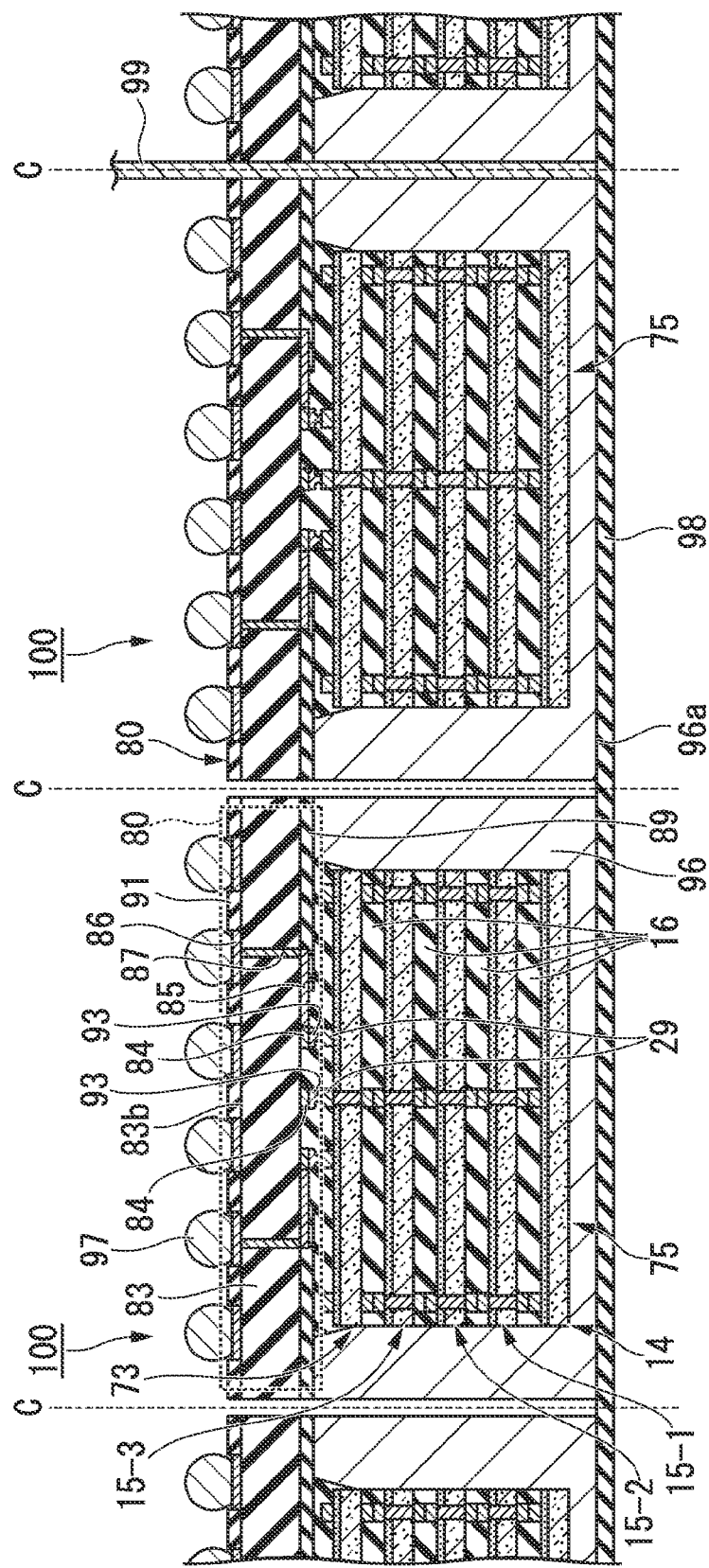
FIG. 17 is a fragmentary cross sectional elevation view of a step, subsequent to the step of FIG. 16, involved in a method of manufacturing a semiconductor device using the apparatus of FIG. 1.

After that, in the process step shown in FIG. 17, a dicing tape 98 is attached to the upper surface 96*a* of the molding resin 96. Next, a dicing blade 99 is used to dice the interconnect motherboard 81 and the molding resin 96 shown in FIG. 16 along the dicing line C, thereby separating a plurality of semiconductor devices 100 into the individual pieces. When this is done, the interconnect substrate 80 is also separated into individual pieces.

Figure 18:
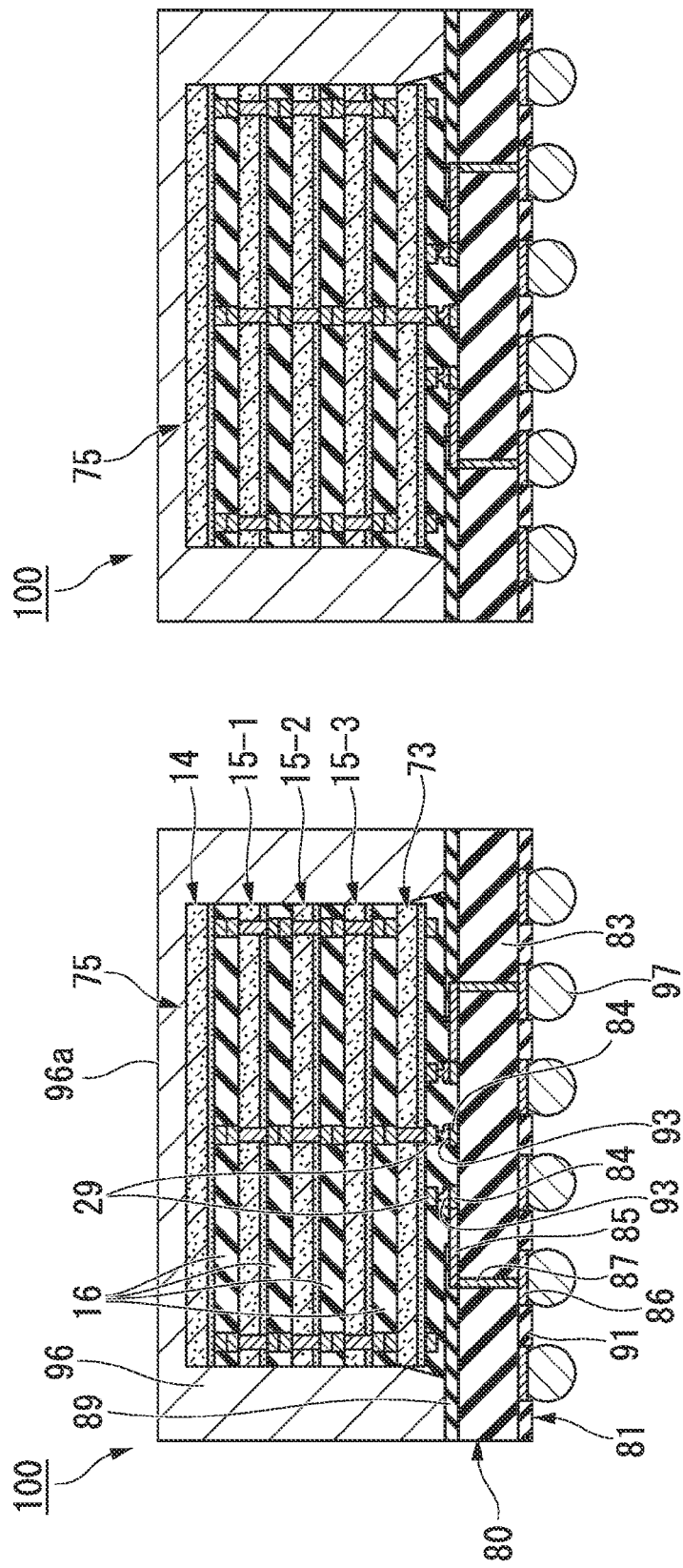
FIG. 18 is a fragmentary cross sectional elevation view of a step, subsequent to the step of FIG. 17, involved in a method of manufacturing a semiconductor device using the apparatus of FIG. 1.

Next, in the process step shown in FIG. 18, the structure shown in FIG. 17 is turned upside-down, after which the dicing tape is peeled away, thereby manufacturing a plurality of CoC (chip-on-chip) type semiconductor devices 100.

According to the method for manufacturing a semiconductor device of the first embodiment, by disposing the sealing resin 16 that is made into the liquid state onto the first semiconductor chip 14 mounted on the stage 11, followed by picking up the second semiconductor chip 15-1 using the bonding tool 12 and bringing the first electrodes 23 and the third electrodes 31 into opposition, after which, while heating each of the first and second semiconductor chips 14, 15-1, the second electrodes 29 are pressed against by the pressure surface 41*a* so as to hot-press bond the first electrodes 23 and the third electrodes 31 and the gaps formed between the first semiconductor chip 14 and the second semiconductor chip 15-1 are filled with the sealing resin 16 that is made into the liquid state, after which the liquid-state sealing resin 16, and the pressure surface 41*a* directly presses the second electrodes 29. By doing this, it is possible to reliably electrically connect the first electrodes 23 and the third electrodes 31 and to improve the electrical connection reliability between the first semiconductor chip 14 and the second semiconductor chip 15-1. Additionally, when the sealing resin 16 that is made into the liquid state is repulsed by pressure from the second semiconductor chip 15-1, the electrode-free surface 26*b* of the second semiconductor chip 15-1 that attempts to deform (bow) is brought into contact with the flat supporting surface 42*a* of the support 42, thereby enabling suppression of the deformation of the second semiconductor chip 15-1, so that it is possible to suppress the occurrence of chip cracking in the second semiconductor chip 15-1 that is made thin (for example, with a thickness of 50 μm or less).

By a method similar according to the method for manufacturing the semiconductor device of the first embodiment, which is described above, by repeating a step of forming the sealing resin 16 made in the liquid state and a step of pressing the second semiconductor chip onto the sealing resin 16, the second semiconductor chips 15-2, 15-3 and 73 are successively mounted onto the second semiconductor chip 15-1, thereby enabling suppression of the occurrence of chip cracking in the second semiconductor chips 15-2, 15-3, 73, even though the plurality of chips 15-2, 15-3, 73 that are made thin (for example, with a thickness of 50 μm or less) are stack mounted.

Second Embodiment

FIG. 22 to FIG. 25 are cross-sectional views showing process steps for manufacturing the semiconductor device according to the second embodiment of the present invention. In FIG. 22 to FIG. 25, constituent elements that are similar to ones shown in FIG. 9 and FIG. 14 described in the first embodiment are assigned the same reference numerals.

FIG. 22 to FIG. 25 omits the illustration of the first vacuum chucking holes 36 and the first heating mechanisms 37 that are provided in the stage 11.

A method for manufacturing a semiconductor device 115 of the second embodiment (refer to FIG. 25 described later) using the semiconductor device manufacturing apparatus 10 shown in FIG. 1 will be described, referring mainly to FIG. 22 to 25.

Figure 22:
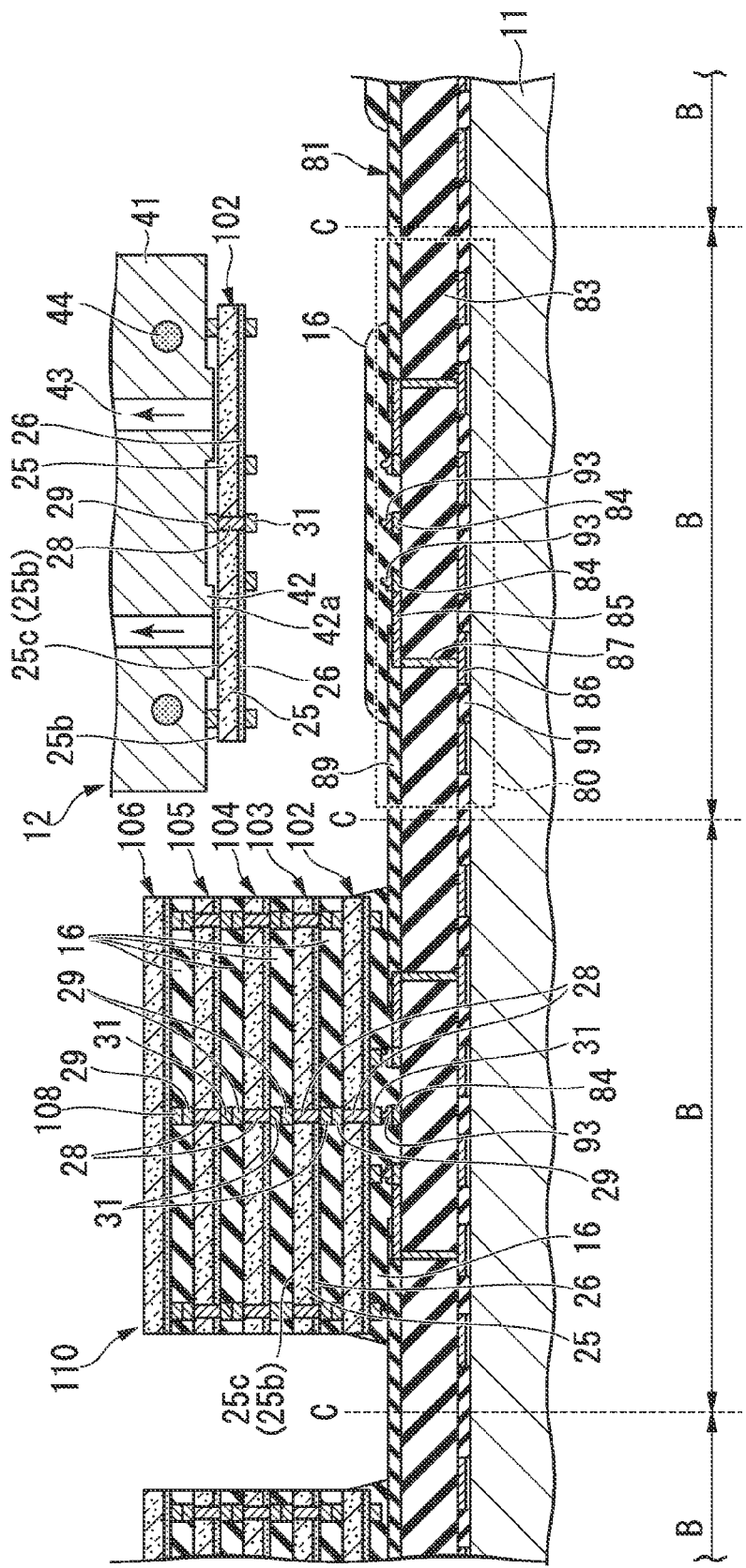
FIG. 22 is a fragmentary cross sectional elevation view of a step involved in a method of manufacturing a semiconductor device using the apparatus in a second embodiment of the present invention.

First, before the processing of the process step shown in FIG. 22, semiconductor chips 102 to 106 (a plurality of semiconductor chips) shown in FIG. 22, and the interconnect motherboard 81 shown in FIG. 13, which have been described before, are prepared.

Referring to FIG. 9 and FIG. 22, the semiconductor chips 102 to 106 that constitute the semiconductor device 115 of the second embodiment will be described.

The semiconductor chip 102 has a constitution similar to that of the second semiconductor chip 73, with the exception of exchanging the positions of formation of the second electrodes 29 into the third electrodes 31 provided on the second semiconductor chip 73, and also providing an electrode-free surface 25c onto a reverse surface 25b of a semiconductor substrate 25 instead of the electrode-free surface 26b, shown in FIG. 9. That is, the semiconductor chip 102 has the through electrodes 28 and is an interface semiconductor chip that is made thin (for example, with a thickness of 50 µm or less).

The semiconductor chips 103 to 105 have a constitution similar with that of the second semiconductor chip 15-1, with the exception of exchanging the positions of formation of the second electrodes 29 onto the third electrodes 31 provided on the second semiconductor chip 15-1 and also providing the electrode-free surface 25c onto the reverse surface 25b of the semiconductor substrate 25 instead of the electrode-free surface 26b, shown in FIG. 9. That is, the semiconductor chips 103 to 105 have the through electrodes 28 and are memory semiconductor chips that are made thin (for example, with a thickness of 50 µm or less).

The semiconductor chip 106 has a constitution similar to that of the second semiconductor chip 15-1 with the exception of providing electrodes 108 instead of the first electrodes 23 provided on the first semiconductor chip 14, shown in FIG. 9. That is, the semiconductor chip 106 has the through electrodes 28 and is a memory semiconductor chip that is made thin (for example, with a thickness of 50 µm or less).

The interconnect motherboard 81 is constituted by linking a plurality of interconnect substrates 80, onto which is disposed the sealing resin 16 that is made into the liquid state thereon, and is formed by performing process step similar to those shown in FIG. 11 to FIG. 13, described for the first embodiment. After such formation, the interconnect motherboard 81 is vacuum chucked onto the stage 11. In the case of the second embodiment, the pad electrodes 84 provided on the interconnect motherboard 81 function as the first electrodes.

Next, in the process step shown in FIG. 22, the second vacuum chucking holes 43 in the bonding tool 12 vacuum chuck the electrode-free surface 25c of the semiconductor chip 102 and also the second heating mechanisms 44 heat to and maintain the semiconductor chip 102 at a prescribed temperature (for example, 200° C.). At this stage, the pressure surface 41a makes contact with the second electrodes 29 and the supporting surface 42a of the support 42 does not make contact with the electrode-free surface 25c.

Next, the semiconductor chip 102 that is vacuum chucked by the bonding tool 12 is placed above the interconnect substrate 80 formed on the interconnect motherboard 81 so that the third electrodes 31 oppose the pad electrodes 84 on which the wire bumps 93 are formed.

Figure 23:
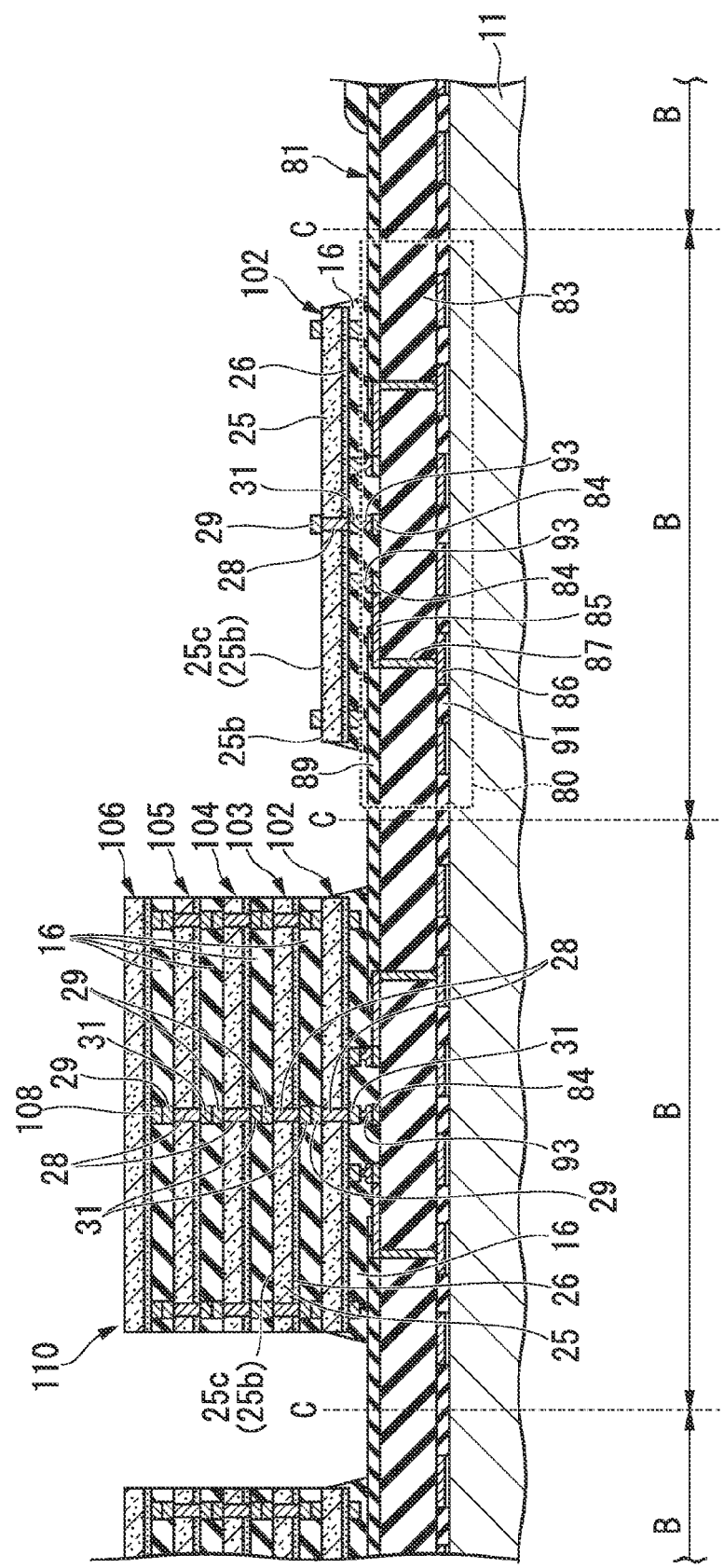
FIG. 23 is a fragmentary cross sectional elevation view of a step, subsequent to the step of FIG. 22, involved in a method of manufacturing a semiconductor device using the apparatus in the second embodiment of the present invention.

Next, in the process step shown in FIG. 23, by a procedure similar to that of the process step shown in FIG. 6 described in the first embodiment, the third electrodes 31 and pad electrodes 84 are electrically connected (flip-chip connected) via the wire bumps 93, and the sealing resin 16 that is made into the liquid state fills the gaps formed between the semiconductor chip 102 and the interconnect substrate 80.

Figure 24:
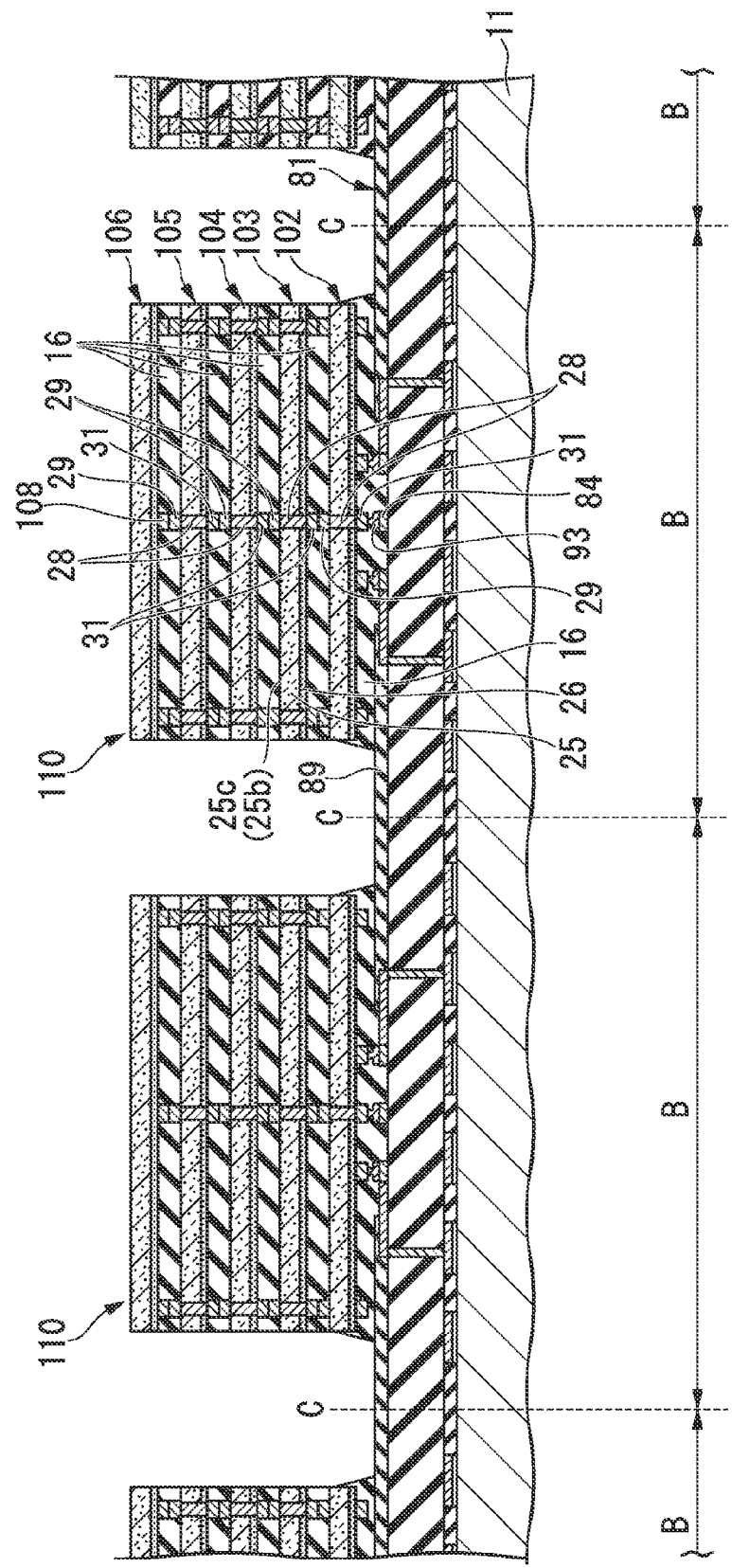
FIG. 24 is a fragmentary cross sectional elevation view of a step, subsequent to the step of FIG. 23, involved in a method of manufacturing a semiconductor device using the apparatus in the second embodiment of the present invention.

Next, in the process step shown in FIG. 24, by a procedure similar to that of the processing of the process step shown in FIG. 7 and FIG. 8 described in the first embodiment, the semiconductor chip 103 is mounted onto the semiconductor chip 102 via the sealing resin 16 that is made into the liquid state. By doing this, an electrical connection between the second electrodes 29 provided on the semiconductor chip 102 and the third electrodes 31 provided on the semiconductor chip 103 is made, and also the sealing resin 16 tills the gaps formed between the semiconductor chip 102 and semiconductor chip 103.

Next, by a procedure similar to that of the process step shown in FIG. 7 and FIG. 8 described in the first embodiment, the semiconductor chip 104 is mounted onto the semiconductor chip 103 via the sealing resin 16 that is made into the liquid state. By doing this, an electrical connection between the second electrodes 29 provided on the semiconductor chip 103 and the third electrodes 31 provided on the semiconductor chip 104 is made, and also the sealing resin 16 fills the gaps formed between the semiconductor chip 103 and semiconductor chip 104.

Next, by a procedure similar to that of the process step shown in FIG. 7 and FIG. 8 described in the first embodiment, the semiconductor chip 105 is mounted onto the semiconductor chip 104 via the sealing resin 16 that is made into the liquid state. By doing this, an electrical connection between the second electrodes 29 provided on the semiconductor chip 104 and the third electrodes 31 provided on the semiconductor chip 105 is made, and also the sealing resin 16 fills the gaps formed between the semiconductor chip 104 and semiconductor chip 105.

Next, by a procedure similar to that of the process step shown in FIG. 7 and FIG. 8 described in the first embodiment, the semiconductor chip 106 is mounted onto the semiconductor chip 105 via the sealing resin 16 that is made into the liquid state. By doing this, an electrical connection between the second electrodes 29 provided on the semiconductor chip 105 and the electrodes 108 provided on the semiconductor chip 106 is made, and also the sealing resin 16 fills the gaps formed between the semiconductor chip 105 and semiconductor chip 106.

The structure made of the semiconductor chips 102 to 106 that are laminated via the above-noted the sealing resin 16 is formed with respect to the each of the interconnect substrates 80. After doing this, the sealing resin 16 that was made into the liquid state is caused to be completely cured.

By doing this, a chip laminate 110 made of semiconductor chips 102 to 106 stacked onto the interconnect substrate 80 and the sealing resin 16 is formed.

Figure 25:
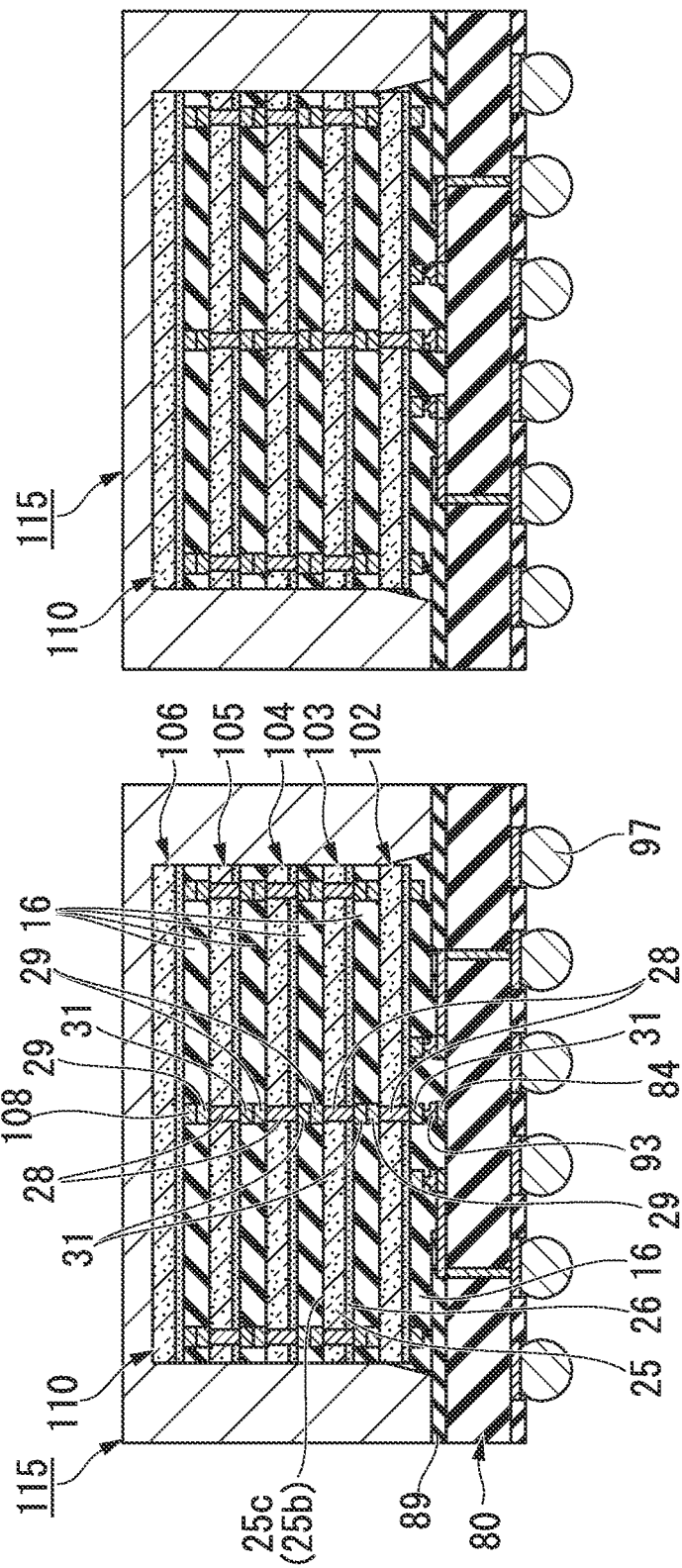
FIG. 25 is a fragmentary cross sectional elevation view of a step, subsequent to the step of FIG. 24, involved in a method of manufacturing a semiconductor device using the apparatus in the second embodiment of the present invention.

Next, in the process step shown in FIG. 25, the interconnect motherboard 81 forming a plurality of chip laminations 110 is removed from the stage 11 shown in FIG. 24, after which, by performing a procedures similar to that of the process steps shown in FIG. 15 to 18, which have been described in the first embodiment, a plurality of CoC type semiconductor devices 110 are manufactured.

According to the method for manufacturing the semiconductor device of the second embodiment, an effect similar to that of the method for manufacturing the semiconductor device 100 of the first embodiment can be achieved.

Specifically, even if a plurality of semiconductor chips 102 to 105 that have the through electrodes 28 and that are made thin (for example, with a thickness of 50 μm or less) are stack-mounted, it is possible to suppress the occurrence of chip cracking in the semiconductor chips 102 to 105.

The interconnect motherboard 81 linked with a plurality of interconnect substrates 80 is vacuum chucked onto the stage 11, and a plurality of semiconductor chips 102 to 106 are mounted onto the interconnect substrate 80, with the interconnect motherboard 81 functioning as a supporter, so that it is possible to stably vacuum chuck the interconnect motherboard 81 onto the stage 11.

By doing this, when the semiconductor chips 102 to 106 are mounted, it is possible to use the thermosonic bonding.

By using the thermosonic bonding as the method for electrically connecting between a plurality of semiconductor chips 102 to 106 in this manner, because it is possible to process an electrical connection between the chips at the lower temperature than in the first embodiment, it is possible to suppress damage to the plurality of semiconductor chips 102 to 106 caused by heat occurring at the time of mounting the plurality of semiconductor chips 102 to 106.

Third Embodiment

FIG. 26 to FIG. 31 are cross-sectional views showing process steps for manufacturing the semiconductor device according to the third embodiment of the present invention. In FIG. 26 to FIG. 31, parts of the structure that are the same as the structures shown in FIG. 4 and FIG. 9 are assigned the same reference numerals.

A method for manufacturing a semiconductor device 130 (refer to FIG. 31 described later) according to the third embodiment of the present invention will be described, referring mainly to FIG. 26 to 31.

Figure 26:
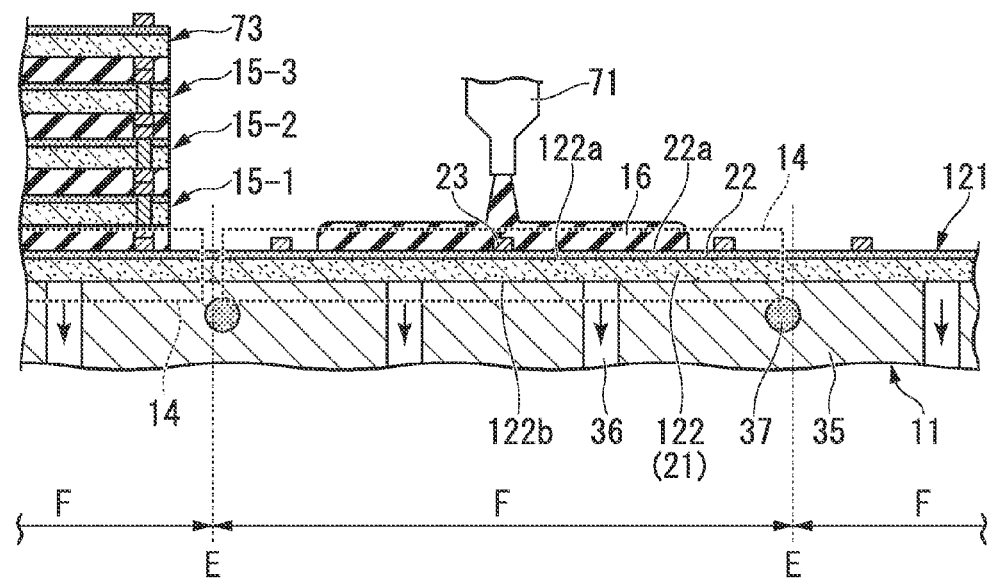
FIG. 26 is a fragmentary cross sectional elevation view of a step involved in a method of manufacturing a semiconductor device using the apparatus in a third embodiment of the present invention.

First, before processing of the step shown in FIG. 26, the second semiconductor chips 15-1, 15-2, 15-3, and 73, which have been described in the first embodiment, are prepared.

Next, a chip motherboard 121 shown in FIG. 26 is prepared. The constitution of the chip motherboard 121 will be described with references made to FIG. 26.

The chip motherboard 121 is constituted such that the first semiconductor chips 14 shown in FIG. 4 are formed onto a plurality of chip formation regions F that are partitioned by dicing lines E, on the semiconductor wafer 122 (for example, silicon wafers).

That is, the chip motherboard 121 is constituted by linking a plurality of the first semiconductor chips 14.

By cutting along the dicing lines E, the semiconductor wafer 122 becomes a plurality of semiconductor substrates 21 shown in FIG. 1. The element layer 22 is formed on the front surface 122a of the semiconductor wafer 122.

Next, the chip motherboard 121 is vacuum chucked onto the stage 11 so that the rear surface 122b of the semiconductor wafer 122 makes contact therewith.

Next, the dispenser 71 disposes the liquid-state sealing resin 16 onto the upper surface 22a of the element layer 22. At this stage, the sealing resin 16 is not hardened. An NCP, for example, can be used as the sealing resin 16 that is made into the liquid state.

Figure 27:
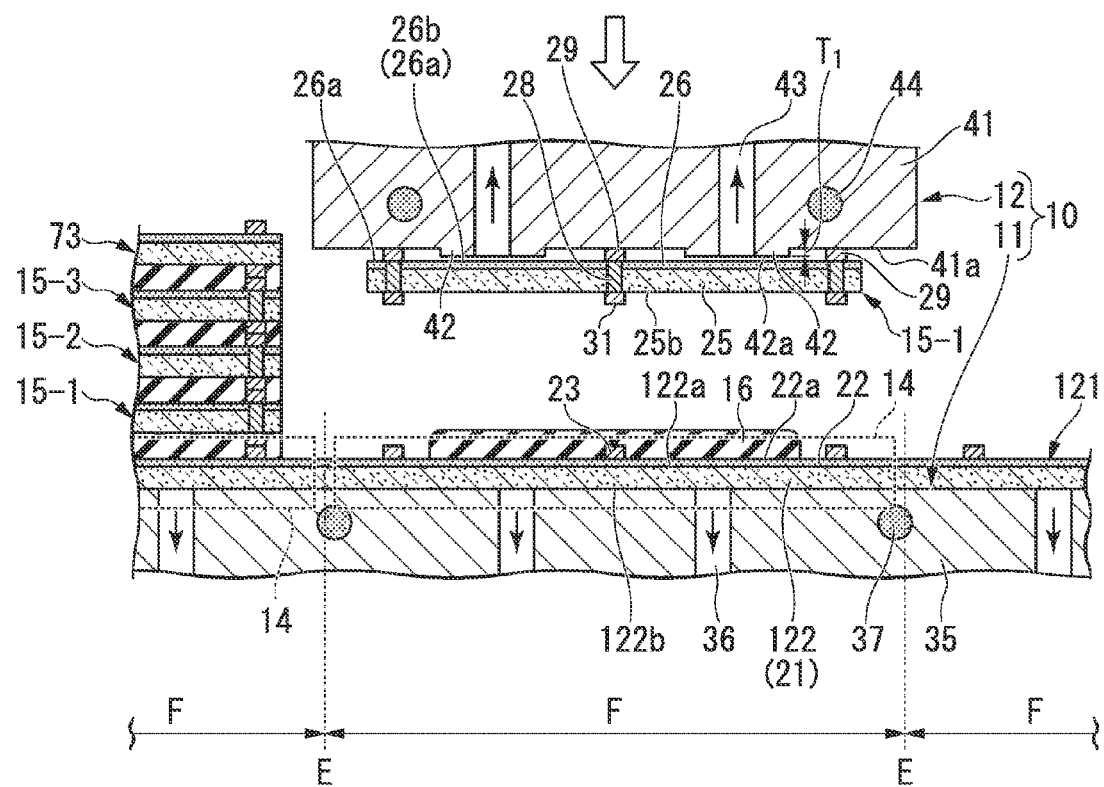
FIG. 27 is a fragmentary cross sectional elevation view of a step, subsequent to the step of FIG. 26, involved in a method of manufacturing a semiconductor device using the apparatus in the third embodiment of the present invention.

Next, in the process step shown in FIG. 27, the bonding tool 12 heats and maintains the second semiconductor chip 15-1 at a prescribed temperature (for example, 200° C.). At this stage, the pressure surface 41a makes contact with the upper end of the second electrodes 29 and the supporting surface 42a of the support 42 does not make contact with the electrode-free surface 26b.

Next, the second semiconductor chip 15-1 that is vacuum chucked by the bonding tool 12 is placed above the first semiconductor chip 14 provided on the chip motherboard 121 so that the third electrodes 31 oppose the first electrodes 23.

Figure 28:
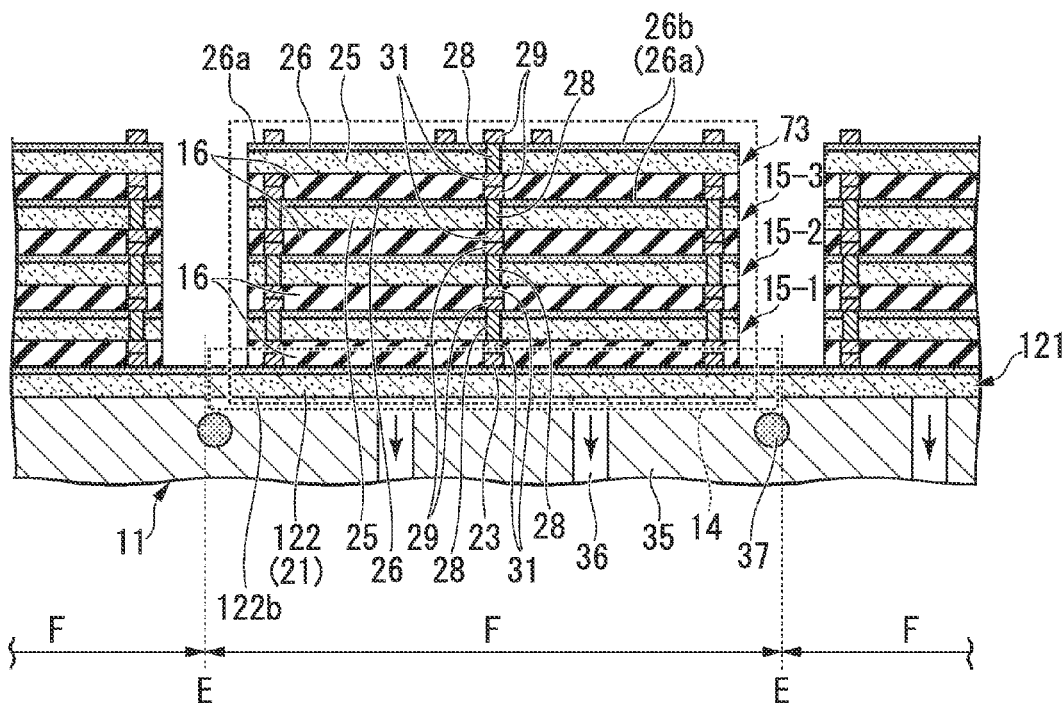
FIG. 28 is a fragmentary cross sectional elevation view of a step, subsequent to the step of FIG. 27, involved in a method of manufacturing a semiconductor device using the apparatus in the third embodiment of the present invention.

Next, in the process step shown in FIG. 28, by repeating process steps similar to the process steps shown in FIG. 6 to FIG. 9 described in the first embodiment, a plurality of chip laminations 125 made of the first and second semiconductor chips 14, 15-1, 15-2, 15-3, 73 stacked onto the chip formation region F in semiconductor wafer 122 and the cured sealing resin 16 are formed.

At this stage, because a plurality of the first semiconductor chips 14 are linked, the plurality of the chip laminations 125 are not separated into the individual pieces.

Figure 29:
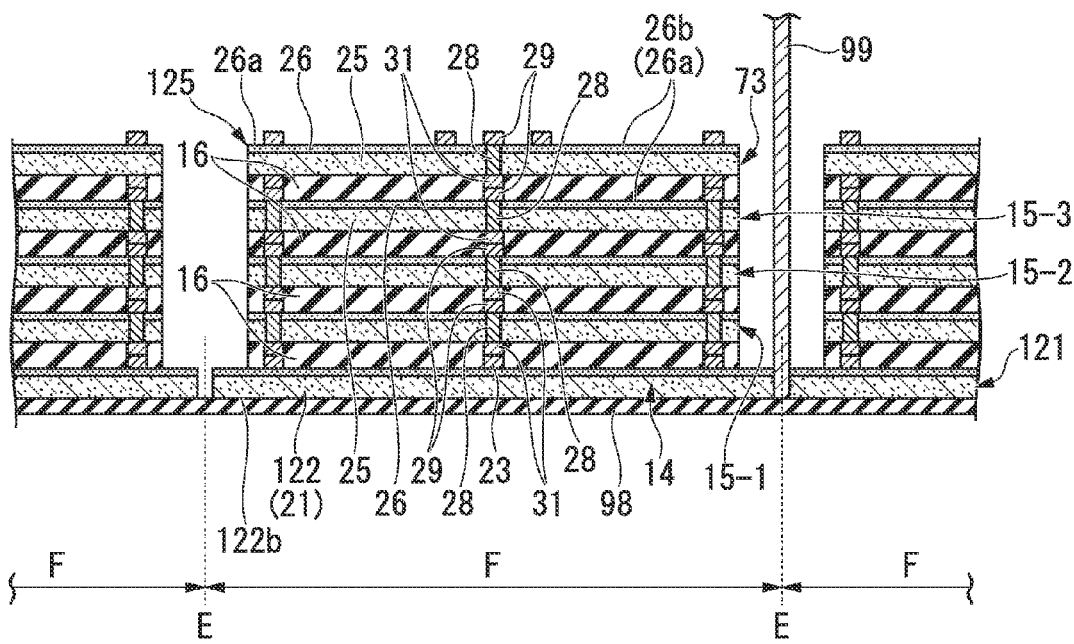
FIG. 29 is a fragmentary cross sectional elevation view of a step, subsequent to the step of FIG. 28, involved in a method of manufacturing a semiconductor device using the apparatus in the third embodiment of the present invention.

Next, in the process step shown in FIG. 29, the semiconductor wafer 122 on which is formed a plurality of chip laminations 125 shown in FIG. 28 is removed from the stage 11, after which the dicing tape 98 is attached to the rear surface 122b of the semiconductor wafer 122.

Next, the dicing blade 99 is used to dice along the dicing lines E the chip motherboard 121 shown in FIG. 28, thereby separating a plurality of first semiconductor chips 14 into the individual pieces. By doing this, a plurality of chip laminations 125 are separated into the individual pieces in a condition in which they are attached to the dicing tape 98.

Figure 30:
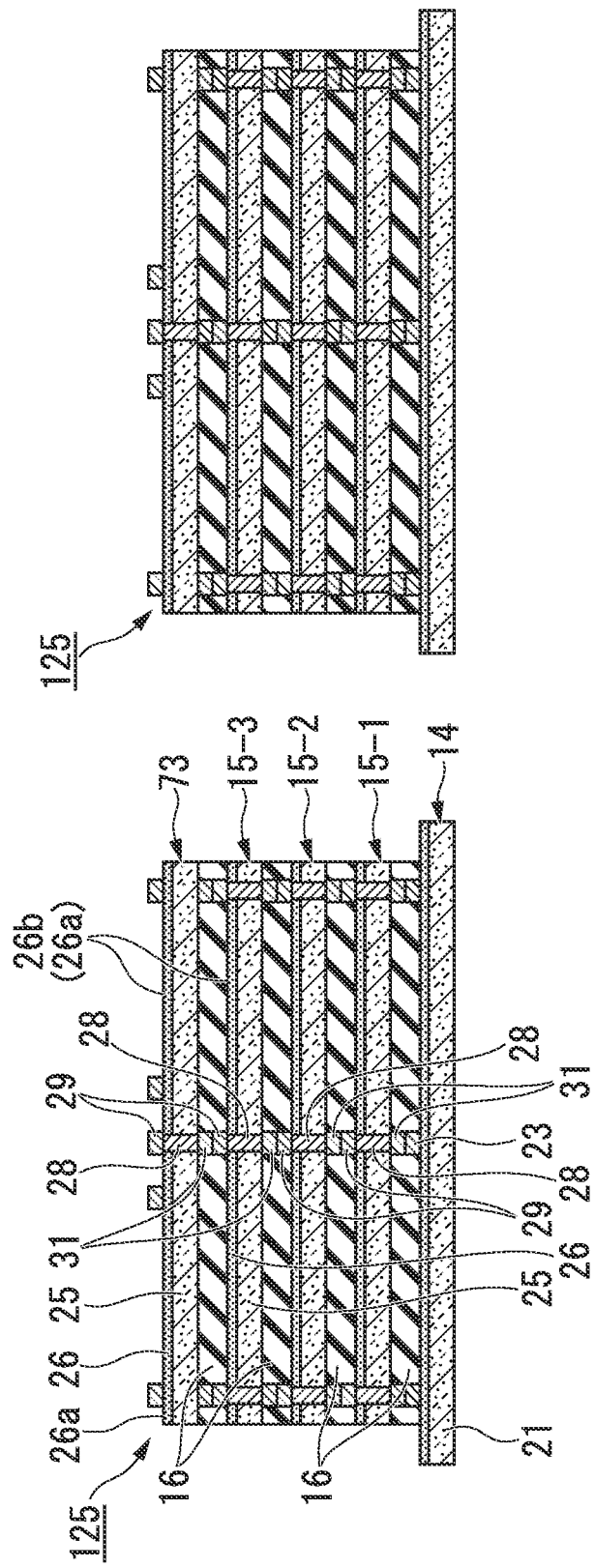
FIG. 30 is a fragmentary cross sectional elevation view of a step, subsequent to the step of FIG. 29, involved in a method of manufacturing a semiconductor device using the apparatus in the third embodiment of the present invention.

Next, in the process step shown in FIG. 30, the dicing tape 98 is peeled away from the plurality of first semiconductor chips 14 shown in FIG. 29, thereby forming a plurality of chip laminations 125 that are separated into the individual pieces.

Figure 31:
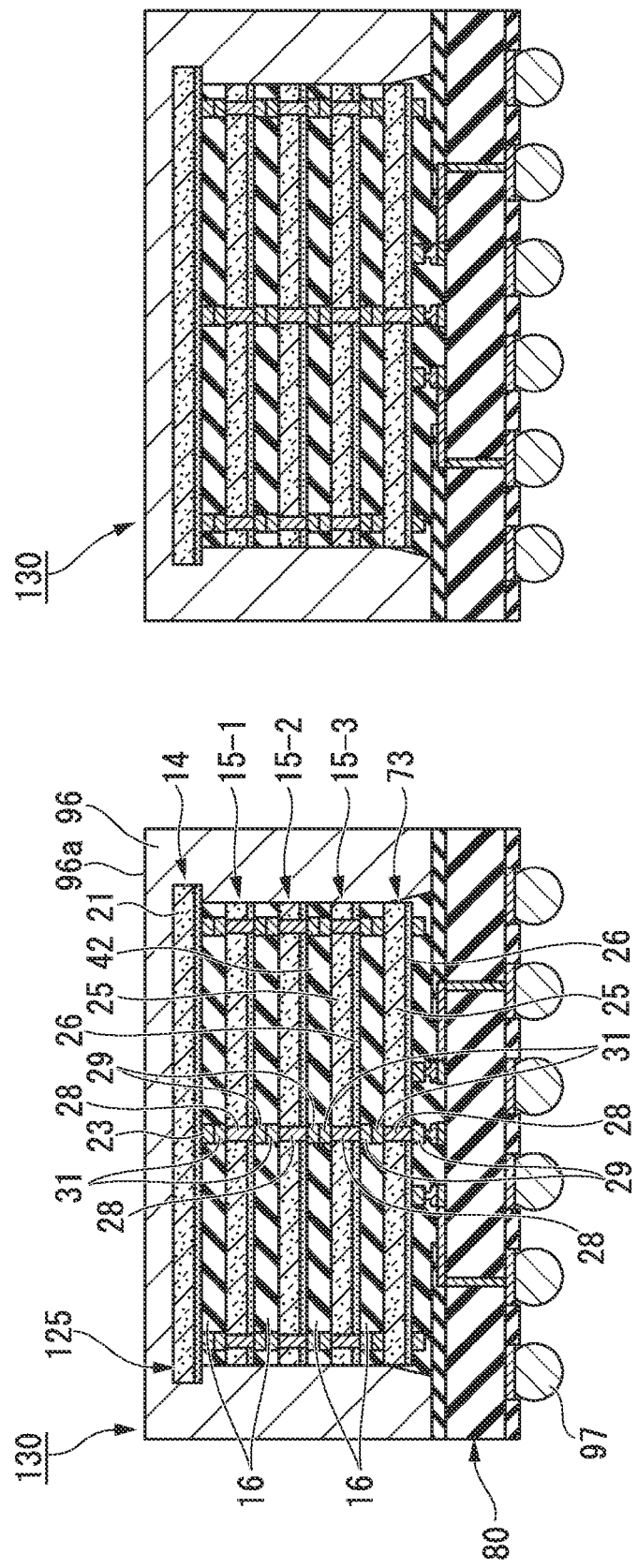
FIG. 31 is a fragmentary cross sectional elevation view of a step, subsequent to the step of FIG. 30, involved in a method of manufacturing a semiconductor device using the apparatus in the third embodiment of the present invention.

Next, in the process step shown in FIG. 31, by performing a procedure similar to that of the process steps shown in FIG. 11 to 18, which have been described in the first embodiment, a plurality of the CoC type semiconductor devices 130 are manufactured.

According to the method for manufacturing the semiconductor device of the third embodiment, an effect similar to that of the method for manufacturing the semiconductor device 100 of the first embodiment can be achieved.

Specifically, even if a plurality of second semiconductor chips 15-1, 15-2, 15-3, and 73 that have the through electrodes 28 and that are made thin (for example, with a thickness of 50 μm or less) are stack-mounted, it is possible to suppress the occurrence of chip cracking in the semiconductor chips 15-1, 15-2, 15-3, and 73.

By vacuum chucking the chip motherboard 121 on which a plurality of first semiconductor chips 14 are linked to onto the stage 11 and mounting the second semiconductor chips 15-1, 15-2, 15-3, 73 onto the first semiconductor chip 14, with the chip motherboard 121 functioning as a supporter, it is possible to stably vacuum chuck the chip motherboard 121 onto the stage 11.

By doing this, when the second semiconductor chips 15-1, 15-2, 15-3, and 73 are mounted, it is possible to use the thermosonic bonding.

By using the thermosonic bonding as the method for electrically connecting between the first and second semiconductor chips 14, 15-1, 15-2, 15-3, and 73 in such a manner, because it is possible to process the electrical connection between the chips at a lower temperature than that in the first embodiment, it is possible to suppress damages to the first and second semiconductor chips 14, 15-1, 15-2, 15-3, and 73, caused by heat occurred at the time of mounting the second semiconductor chips 15-1, 15-2, 15-3, and 73.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of manufacturing a semiconductor device, the method comprising:
preparing first and second semiconductor chips, the first semiconductor chip including a first electrode on a first surface, and the second semiconductor chip including a second electrode on a second surface and a third electrode on a third surface that is opposite to the second surface, the third electrode being overlapped to the second electrode, the second surface including an electrode-free region that is free of any electrode;
applying a sealing resin on the first surface of the first semiconductor chip;
holding the second surface of the second semiconductor chip by a bonding tool including a pressing surface and a supporting-portion projected from the pressing surface, the pressing surface being in contact with the second electrode, the supporting-portion being arranged at a position facing the electrode-free region;
stacking the second semiconductor chip over the first semiconductor chip by the bonding tool so as to electrically connect the third electrode to the first electrode, the sealing resin being filled in a space between the first and second semiconductor chips; and
hardening the sealing resin after stacking the second semiconductor chip on the first semiconductor chip, the first semiconductor chip, the second semiconductor chip and the sealing resin being constructed a stacked structure.

2. The method according to claim 1, wherein the supporting-portion suppresses a deformation of the second semiconductor chip caused by a repulsion of the sealing resin, when the stacking the second semiconductor chip on the first semiconductor chip by the bonding tool.

3. The method according to claim 1, wherein a height of the projected supporting-portion of the bonding tool is smaller than that of the second electrode.

4. The method according to claim 1, further comprising:
mounting the stacked structure over a wiring board so that the second surface of the second semiconductor chip faces the wiring board, after hardening the sealing resin between the first and second semiconductor chips.

5. The method according to claim 1, wherein a width of the electrode-free region is more than 3.3 mm.

6. The method according to claim 1, further comprising:
preparing a third semiconductor chip including a fourth electrode on a fourth surface and a fifth electrode on a fifth surface that is opposite to the fourth surface, the fifth electrode being overlapped to the fourth electrode, the fourth surface including a electrode-free region that is free of any electrode;
applying an additional sealing resin on the second surface of the second semiconductor chip of the stacked structure;
holding the fourth surface of the third semiconductor chip by the bonding tool, the pressing surface being in contact with the fourth electrode, the supporting-portion being arranged at a position facing the electrode-free region of the third semiconductor chip;
stacking the third semiconductor chip over the second semiconductor chip by the bonding tool so as to electrically connect the fifth electrode to the second electrode, the additional sealing resin being filled in a space between the second and third semiconductor chips; and
hardening the sealing resin between the first and second semiconductor chips and the additional sealing resin between the second and third semiconductor chips.

7. A method of manufacturing a semiconductor device, the method comprising:
holding a chip on a bonding tool, the chip having first and second surfaces opposite to each other and at least a first electrode on the first surface and at least a second electrode on the second surface, the first surface having an electrode-free region that is free of any electrode, the bonding tool comprising: a depressed pressing-portion having a pressing surface configured to press the first electrode; and a projected supporting-portion having a supporting surface adjacent to the pressing surface, the supporting surface being configured to support the electrode-free region, the supporting surface being projected from the pressing surface.

8. The method according to claim 7, further comprising:
holding a substrate on a stage, the substrate having an upper surface on which a third electrode is provided; and
applying a sealing resin on the upper surface of the substrate.

9. The method according to claim 8, further comprising:
pressing the bonding tool to the substrate, so that the pressing surface presses the first electrode toward the substrate to bond the second electrode to the third electrode, while the supporting surface supporting the electrode-free region; and
hardening the sealing resin after pressing the bonding tool to the substrate.

10. The method according to claim 9, further comprising:
holding an additional chip on the bonding tool;
applying an additional sealing resin on the chip bonded on the substrate; and
pressing the bonding tool to the additional chip to stack the additional chip on the chip over the substrate; and
hardening the sealing resin between the chip and the substrate and the additional sealing resin between the additional chip and the chip.

11. The method according to claim 7, wherein a difference in level between the supporting surface and the pressing surface is smaller than a dimension of the first electrode from the first surface of the chip.

12. The method according to claim 7, wherein the supporting surface is a flat surface configured to face to the first surface of the chip.

13. The method according to claim 7, wherein holding the chip on the bonding tool comprises holding a chip that has a through electrode connecting the first and second electrode on the first and second surfaces respectively.

14. The method according to claim 9, further comprising: heating at least one of the substrate and the chip before and/or during pressing the bonding tool to the substrate.

15. The method according to claim 9, further comprising: using a wiring mother board having a plurality of wiring boards as the substrate.

16. The method according to claim 9, further comprising: using another chip as the substrate, so that the chip is bonded onto the other chip as the substrate.

17. The method according to claim 9, further comprising: using a mother board having a plurality of connected chips as the substrate.

18. The method according to claim 7, wherein holding the chip on the bonding tool comprises holding a chip that has a plurality of electrodes including the at least second electrode, the plurality of electrodes are arranged to be separated from each other, the electrode-free region isolating the plurality of electrodes from each other.

19. The method according to claim 7, wherein holding the chip on the bonding tool comprises holding a chip that has a plurality of electrodes including the at least second electrode, the plurality of electrodes is positioned in a center region of the chip, and the electrode-free region is positioned outside the center region.

20. The method according to claim 7, wherein holding the chip on the bonding tool comprises holding a chip that has a plurality of electrodes including the at least second electrode, the plurality of electrodes is positioned in a peripheral side region, and the electrode-free region is positioned inside the peripheral side region.

* * * * *